United States Patent [19]
Kajigaya

[11] Patent Number: 4,709,351
[45] Date of Patent: Nov. 24, 1987

[54] SEMICONDUCTOR MEMORY DEVICE HAVING AN IMPROVED WIRING AND DECODER ARRANGEMENT TO DECREASE WIRING DELAY

[75] Inventor: Kazuhiko Kajigaya, Kodaira, Japan

[73] Assignee: Hitachi, Ltd., Tokyo, Japan

[21] Appl. No.: 685,398

[22] Filed: Dec. 24, 1984

[30] Foreign Application Priority Data

Dec. 23, 1983 [JP] Japan ................................. 58-241965

[51] Int. Cl.$^4$ ............................................. B11C 11/40
[52] U.S. Cl. ...................................... 365/51; 365/182; 357/45
[58] Field of Search ................. 365/51, 182, 189, 230; 357/23.1, 23.14, 45

[56] References Cited
U.S. PATENT DOCUMENTS

3,560,940  2/1971  Gaensslen ........................... 365/189

*Primary Examiner*—Terrell W. Fears
*Attorney, Agent, or Firm*—Antonelli, Terry & Wands

[57] ABSTRACT

Word lines of a memory cell array are coupled to the output portion of a first decoder while the input portion of the first decoder is coupled to a plurality of signal lines which are elongated on the memory cell array. The signal lines are provided for a predetermined plurality of word lines, and each of said signal lines can be coupled to the word lines by switching devices. Preferably, the signal lines can be formed of a low resistance material such as aluminum to enhance the speed while the word lines can be formed of polycrystalline silicon to allow simultaneous formation with the memory cell gate electrodes. By virtue of providing each signal line for more than one word line, the design requirements for the signal lines are less stringent than previous arrangements wherein a one-to-one relationship has been attempted between polycrystalline silicon word lines and aluminum connection lines. A further feature of the present invention is the use of a second decoder having an output portion coupled to the signal lines and an input portion coupled to receive selection signals for selecting a predetermined one of the signal lines.

26 Claims, 21 Drawing Figures

- - - - : FIELD INSULATING FILM 12

▭ : 1st POLY-Si LAYER 15

▭ : 2nd POLY-Si LAYER 18

☐ : FIELD INSULATING FILM 12
☐ : 2nd POLY-Si LAYER 15
☐ : 1st Aℓ LAYERS 22, 23 & 45
☒ : CONTACT PORTION

☐ : ACTIVE REGIONS 30 & 31
☐ : 2nd POLY-Si (GATE) LAYERS 26 & 27
☐ : 1st Aℓ LAYERS 33, 34 & 35
▓ : 2nd Aℓ LAYER 25

[ ] : ACTIVE REGION 32

☐ : 2nd POLY-Si (GATE) LAYERS 28 & 29

☐ : 1st Aℓ LAYERS 35, 36, 37 & 38

⊠ : CONTACT PORTION

FIELD INSULATING FILM 12

⌐ ¬
└ ┘ : ACTIVE REGIONS 42 & 43    ▒ : 1st Aℓ LAYERS 44, 45 & 46
☐ : 2nd POLY-Si LAYERS 18, 39, 40 & 41    ⊠ : CONTACT PORTION

☐ : 2nd POLY-Si LAYERS 18 & 39~41

☐ : 1st Aℓ LAYERS 44~46

☐ : 2nd Aℓ LAYER 25

☒ : CONTACT PORTION BETWEEN ACTIVE REGION OR 2nd POLY-Si LAYER AND 1st Aℓ

⊠ : CONTACT PORTION BETWEEN 1st Aℓ – 2nd Aℓ

SEMICONDUCTOR MEMORY DEVICE HAVING AN IMPROVED WIRING AND DECODER ARRANGEMENT TO DECREASE WIRING DELAY

FIELD OF THE INVENTION

The present invention relates to a technique which is effective when applied to a semiconductor integrated circuit device and, more particularly, to a technique which is effective when applied to a semiconductor integrated circuit device equipped with a dynamic random access memory (which will be abbreviated hereinafter as "DRAM").

BACKGROUND OF THE INVENTION

DRAMs adopting the "folded bit line (two-intersection) construction" generally tend to be highly integrated so as to have their capacity increased and at the same time to be quite fast in operation so as to shorten the time periods for data writing and reading operations. In such a DRAM, the reduction of resistance of the word lines is sometimes an important technical consideration for effecting the high speed. Usually, the word lines are formed at a fabrication step identical to and integrally with the gate electrodes of insulated gate type field effect transistors (which will be abbreviated as "MISFETS") in a fabrication process. Therefore, the word lines are required to endure a variety of subsequent hot heat treatment steps such as a heat treatment step for forming the source and drain regions of the MISFETs or a glass flow step of forming an inter-layer insulating film. Also, such word lines are typically made of a conductive material such as polycrystalline silicon. However, this polycrystalline silicon has a defect in that its sheet resistance is higher than that of aluminum which is generally used to make the wires of a semiconductor integrated circuit. Therefore, the use of polycrystalline silicon for the word lines obstructs acceleration of the operating speed.

In order to reduce the substantial resistance of the word lines to thereby accelerate the operating speed, therefore, a DRAM has previously been proposed which adopts the double-layered aluminum wiring structure (1983, IEEE International Solid-State Circuits Conference Digest of Technical Papers, pages 226 and 227). The DRAM adopting the double-layered aluminum wiring is specifically constructed of: a first polycrystalline silicon layer forming the capacity element of a memory cell; a second polycrystalline silicon layer forming first word lines and the gate electrode of a MISFET; a first aluminum layer forming bit lines; and a second aluminum layer forming second word lines extending in the same direction as the extending direction of the first word lines so as to reduce the resistance of the first word lines. The second word lines are the same in number as the first word lines, and the second word lines and the first word lines are electrically connected through connecting holes, which are formed at a predetermined pitch in their interlayer insulating film, and through an intermediate conductive member which is formed of the first aluminum layer so as to improve coverage of the second aluminum layer.

As a result of the investigation of the technique thus far described, the inventor has found that the DRAM adopting the double-layered aluminum wiring structure has reduced reliability because of difficulties in forming the second aluminum wiring layer in a highly integrated device. In utilizing high integration and the multi-layered wiring, more specifically, a remarkably strict design rule of the second aluminum layer is required for forming the second word lines in accordance with the pitch of the first word lines. In particular, working problems are liable to occur such as, for example, breaking of the second aluminum wires due to growth of undulations in the upper portion of the inter-layer insulating film and failure of masking registration, short-circuiting between the adjoining second aluminum wires due to inferior patterning or inferior connecting between the first and second aluminum wires. Although the above comments are directed to DRAMs, it is to be noted that similar difficulties can be found in other types of semiconductor memories.

OBJECTS OF THE INVENTION

An object of the present invention is to provide a technique which can improve the reliability of a semiconductor memory.

Another object of the present invention is to provide a technique which can permit achieving a high degree of integration in a semiconductor memory without creating undesirable wiring delays.

The foregoing and other objects and new features of the present invention will become apparent from the following description taken in conjunction with the accompanying drawings.

SUMMARY OF THE INVENTION

To accomplish the above and other objects, there is disposed in a predetermined portion of a memory cell array a decoder which is connected with the output portion of the memory cell array for selecting word lines. Signal lines having a lower resistance than the word lines (for example, signal lines formed of aluminum) are disposed in the input portion of said decoder, with each of the signal lines being provided for a predetermined number of the word lines. By virtue of using such signal lines (which do not require a one-to-one correspondence with the word lines) the working problems of a memory adopting double-layered aluminum wiring can be prevented to improve the reliability by lessening the design rule for forming the signal lines of aluminum in comparison with the prior double-layered aluminum wiring technique.

DETAILED DESCRIPTION

The present invention will now be described in the following in connection with the embodiments thereof.

Figure 1:
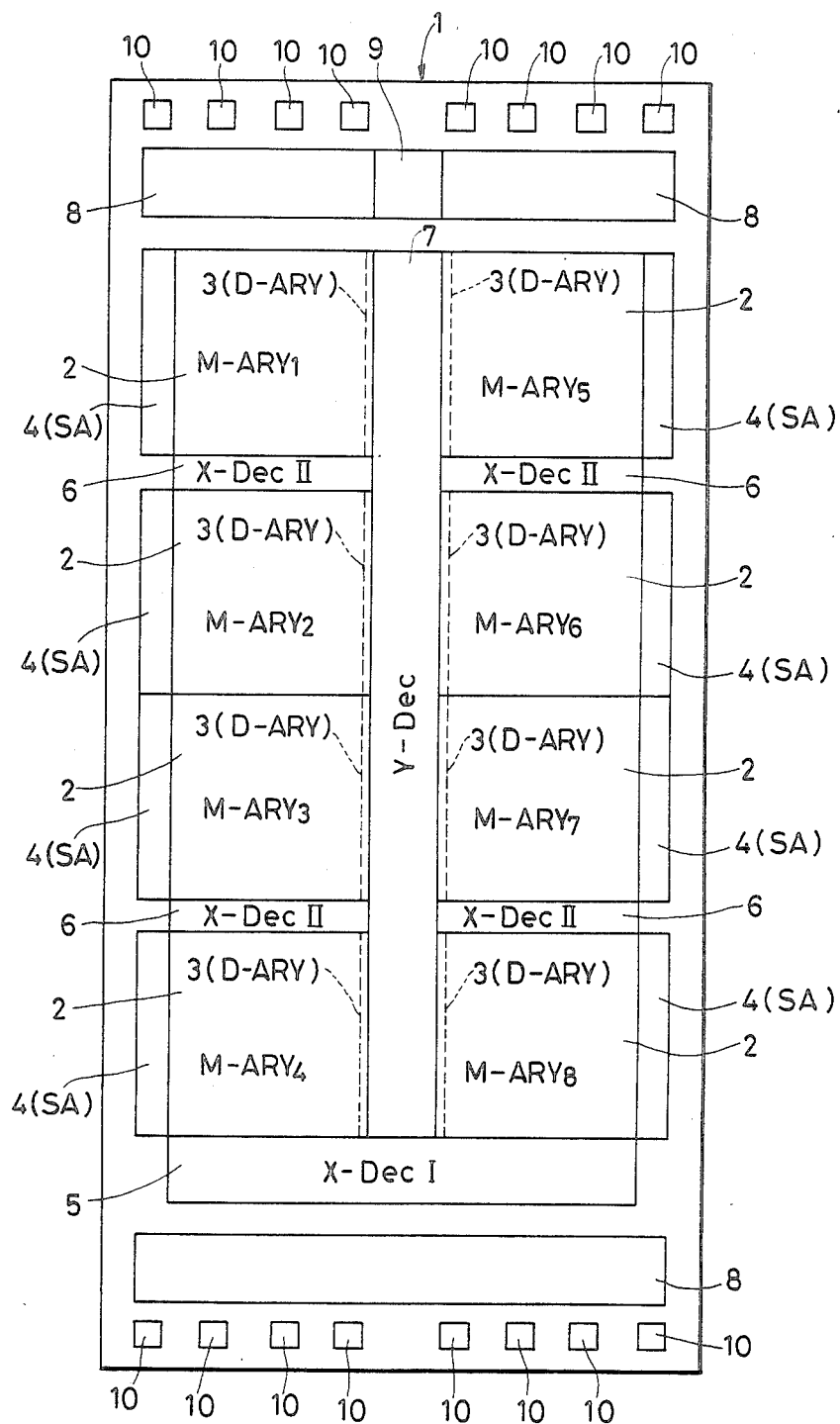
FIG. 1 is a schematic top plan view showing the DRAM for explaining the embodiment I of the present invention.

Embodiment I:

FIG. 1 is a schematic top plan view showing the layout pattern of a DRAM which adopts the folded bit line construction for explaining the embodiment I of the present invention. The present embodiment will be described in connection with the so-called "eight mat type DRAM" in which the memory cell array is divided into eight arrays in one semiconductor integrated circuit device.

Throughout the figures of the embodiments, incidentally, parts having the identical functions are indicated at identical reference characters, and their repeated explanations are omitted.

In FIG. 1, reference numeral 1 indicates the DRAM which has a memory function. Indicated at numeral 2 are memory cell arrays (M-ARY) which are arranged at the central portion of the DRAM thereby to construct the DRAM 1. The memory cell arrays 2 are constructed of plural rows and columns of memory cells each of which is composed of a series connection of a capacity element (i.e., a capacitor) $C_M$ for storing charges for data and a switching element (MISFET) $Q_M$. Moreover, the memory cell arrays 2 are arranged in columns (M-ARY$_1$ to M-ARY$_4$ and M-ARY$_5$ to M-ARY$_8$) to construct memory cell array columns. Incidentally, a DRAM 1 adopting a system such as the illustrated eight mat system has much shorter word lines that a DRAM which does not adopt such a system in terms of extending in a column direction from a later-described X-decoder II over the memory cell array 2. Therefore, utilizing the present invention in conjunction with a system such as the illustrated eight-mat system, although not required, serves to drop the resistance of the word lines.

Numeral 3 of FIG. 1 illustrates dummy cell arrays (D-ARY) which are arranged on row-directional one-side end portions of the memory cell arrays 2 thereby to construct the DRAM 1. The dummy cell arrays 3 are constructed in a conventional manner of plural columns of dummy cells each of which is composed of a capacity element $C_D$ for storing charges for judging the data stored in the memory cell, a switching element (MISFET) $Q_D$, and a clearing MISFET for clearing the charges stored in the capacity element $C_D$. Indicated at numeral 4 are sense amplifiers (SA) which are disposed at the row-directional other side end portions of the memory cell arrays 2. The sense amplifiers 4 are constructed in a conventional manner to amplify the difference between the charges, which are stored in the capacity elements $C_M$ of the memory cells and the capacity elements $C_D$ of the dummy cells, respectively, through their respective switching elements $Q_M$ and $Q_D$ and the bit lines which extend in the row direction through the memory cell arrays 2. Indicated at numeral 5 is an X-decoder I (X-Dec I) which is disposed at one-side end portions of the individual memory cell array columns. The X-decoder I is connected electrically with one of a predetermined number of word lines through a later-described X-decoder II and is adapted to select one of signal lines which extend in the same direction as that of the word lines. Indicated at numeral 6 are the X-decoders II (X-Dec II) which are disposed at column-directional one-side end portions of the memory cell arrays 2, i.e., interposed between the predetermined memory cell arrays 2 of the memory cell array columns. The X-decoders II are adapted to connect electrically one signal line extending from the output portion of the X-decoder I 5 with one of a predetermined number of word lines connected with an output portion of the X-decoder II. Indicated at numeral 7 is a Y-decoder (Y-Dec) which is interposed between the memory cell array columns. The Y-decoder 7 is adapted to select a predetermined one of the bit lines which extend in the row direction from both the side end portions thereof over the individual memory cell arrays 2.

Numeral 8 indicates generally peripheral circuits which are disposed at the upper and lower end portions of the DRAM 1. Indicated at numeral 9 is a main amplifier which is interposed between the peripheral circuits 8 at the upper end portion. Indicated at numeral 10 are external terminals (i.e., bonding pads) which are disposed at the upper and lower end portions of the DRAM 1.

Because such peripheral circuitry for DRAMs is well known, and does not form part of this invention, it is not illustrated in detail. However, for purposes of general information, it is noted that such peripheral circuitry could include an address buffer which receives external address signals through the external terminals (i.e. bonding pads) 10, and generates internal complementary address signals $A_{\overline{x1}}$ to $A_{x8}$ and so on for decoders. A data input buffer and a data output buffer would also be provided to receive outputs of the main amplifier 9 and output a data signal to be supplied to the external terminal 10. The peripheral circuitry could also include a timing generator which receives control signals such as an external $\overline{RAS}$ (row address strobe) signal, an external $\overline{CAS}$ (column address strobe) signal, and an external $\overline{WE}$ (write enable) signal, and which generates timing signals $\phi_x$, $\overline{RAS}_2$ and so on for controlling the operations of the decoders, sense amplifier, main amplifier, address buffer, data input buffer and data output buffer. Further, a back bias generator would generally be provided to receive a positive power supply voltage $V_{CC}$ and generate a negative bias voltage for a semiconductor substrate. Finally, if desired, it is possible to add an auto refresh circuit and a data output controller to the peripheral circuit 8, in order to make possible an auto refreshing operation and a nibble operation in the DRAM, in a well-known manner.

Next, the X-decoder I, X-decoders II and memory cell arrays will be described in connection with their specific constructions. Incidentally, the present embodiment will be described for a case where one signal line extendin from the X-decoder I to the X-decoders II is provided for two word lines arranged in the memory cell arrays.

Figure 2:
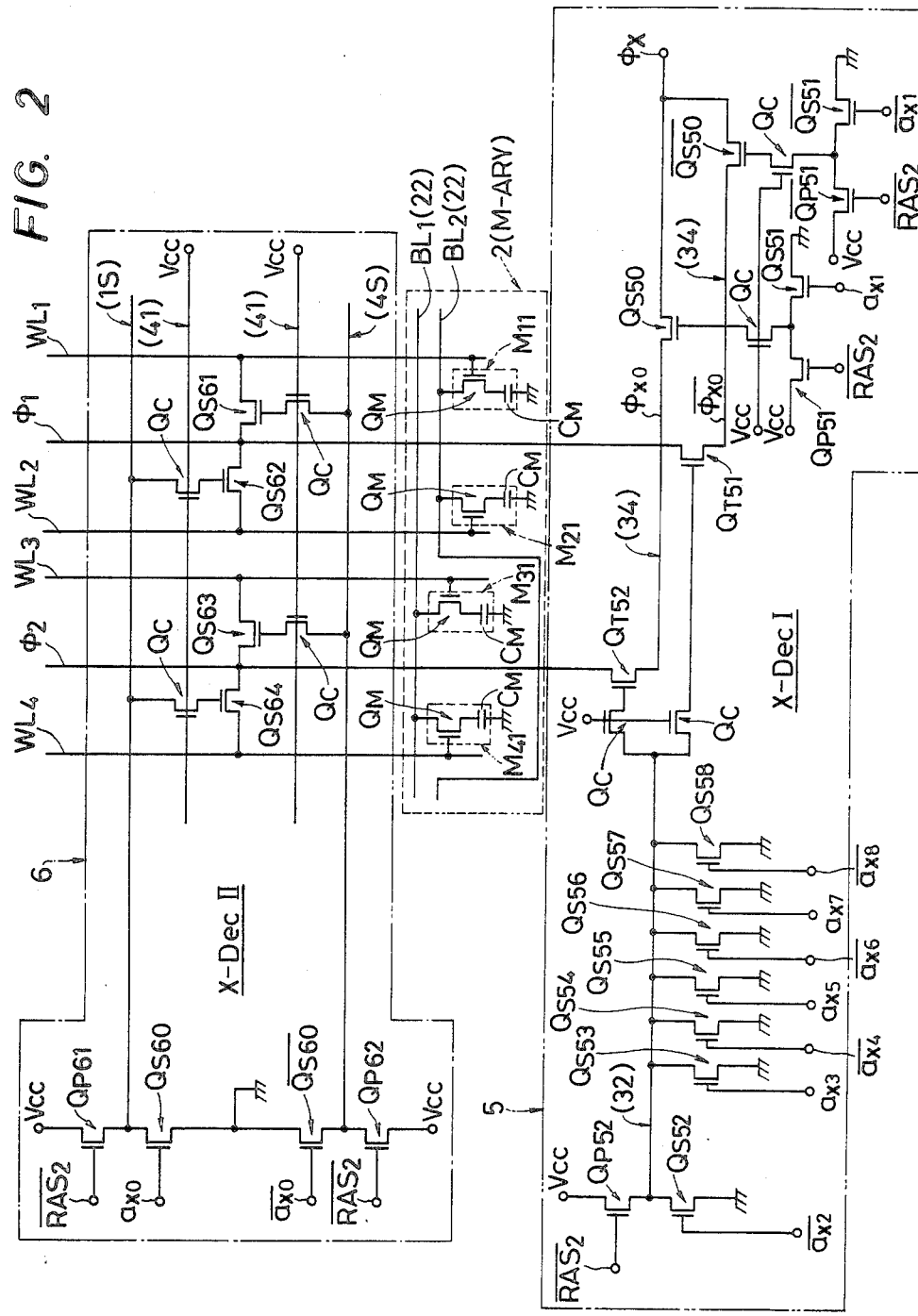
FIG. 2 is an equivalent circuit diagram of the essential portion of the DRAM for explaining the embodiment I of the present invention.

FIG. 2 is an equivalent circuit diagram showing an essential portion of the DRAM for explaining the embodiment I of the present invention.

In FIG. 2, the memory cell arrays 2 will be first described in the following. Indicated at reference characters $M_{11}$, $M_{21}$ and so on are memory cells each of which is constructed of a series connection of the MISFET $Q_M$ acting as a switching element and the capacity element $C_M$ for storing charges for data. Indicated at characters $BL_1$, $BL_2$ and so on are bit lines which extend at a predetermined pitch and in the row direction over the memory cell arrays 2 and which are connected electrically with one-end portions of predetermined ones of the MISFETs $Q_M$. Indicated at characters $WL_1$, $WL_2$ and so on are word lines which extend at a predetermined pitch and in the column direction over the memory cell arrays 2 and which are connected electrically with the gate electrodes of predetermined ones of the MISFETs $Q_M$ thereby to turn "ON" or "OFF" the MISFETs $Q_M$. These word lines WL are connected electrically with the signal lines $\phi_1$, $\phi_2$, which are arranged in the memory cell arrays adjoining in the column direction, and which extend in the column direction in the memory cell array columns.

Next, the X-decoder I 5 will be described in the following. Characters $\overline{RAS_2}$ indicate $\overline{RAS_2}$ precharge signal terminals. Letters $V_{CC}$ indicate $V_{CC}$ voltage (i.e., power supply) terminals. Character $a_{x1}$ indicates an $a_{x1}$ address signal terminal; character $\overline{a_{x1}}$ an $\overline{a_{x1}}$ address signal terminal; character $\overline{a_{x2}}$ an $\overline{a_{x2}}$ address signal terminal; character $a_{x3}$ an $a_{x3}$ address signal terminal; character $\overline{a_{x4}}$ an $\overline{a_{x4}}$ address signal terminal; character $a_{x5}$ an $a_{x5}$ address signal terminal; character $\overline{a_{x6}}$ an $\overline{a_{x6}}$ address signal terminal; character $a_{x7}$ an $a_{x7}$ address signal terminal; and character $\overline{a_{x8}}$ an $\overline{a_{x8}}$ address signal terminal. Letter $\phi_x$ indicates a $\phi_x$ selecting timing signal terminal for selecting the word lines WL. These address signal terminals and the timing signal terminal receive signals from the address buffer and the timing generator, respectively, from the peripheral circuitry 8. Characters $Q_{S50}$ and $Q_{\overline{S50}}$, $Q_{S51}$ and $Q_{\overline{S51}}$, and $Q_{S52}$ to $Q_{S58}$ all indicate switching MISFETs. Characters $Q_{P51}$, $Q_{\overline{P51}}$ and $Q_{P52}$ indicate precharging MISFETs. Letters $Q_C$ indicate cutting MISFETs. Characters $Q_{T51}$ and $Q_{T52}$ indicate transfer MISFETs for the output portion of the X-decoder I 5.

Characters $\phi_1$ and $\phi_2$ indicate signal lines which are provided to extend from the output portions of the transfer MISFETs $Q_{T51}$ and $Q_{T52}$, i.e., the output portion of the X-decoder I 5 to the input portion of the X-decoder II 6 to transmit selecting timing signals $\phi_{x0}$ and $\overline{\phi_{x0}}$, which are decoded by the X-decoder I 5 from the selecting timing signals from the selecting timing signal terminal $\phi_x$ to the input portion of the X-decoder II 6 through the transfer MISFETs $Q_{T51}$ and $Q_{T52}$. The signal lines, such as $\phi_1$ and $\phi_2$ are common to all of the X-decoders II 6 which are arranged in predetermined portions of the memory cell array columns. Moreover, each of those signal lines $\phi_1$ and $\phi_2$ is provided for two of the word lines WL extending in the column direction in the memory cell array columns so that its pitch for arrangment is made looser than that of the arrangement of the word lines.

Next, the X-decoders II 6 will be described in the following. Character $a_{x0}$ indicates an $a_{x0}$ address signal terminal, and character $\overline{a_{x0}}$ indicates an $\overline{a_{x0}}$ address signal terminal. Characters $Q_{P61}$ and $Q_{P62}$ indicate precharging MISFETs. Characters $Q_{S60}$ and $Q_{\overline{S60}}$ indicate switching MISFETs. Character $Q_{S61}$ indicates a switching MISFET which has its one end portion connected with the signal line $\phi_1$ and its other end portion connected with the word line $WL_1$; character $Q_{S62}$ indicates a switching MISFET which has its one end portion connected with the signal line $\phi_1$ and its other end portion connected with the word line $WL_2$; character $Q_{S63}$ indicates a switching MISFET which has its one end portion connected with the signal line $\phi_2$ and its other end portion connected with the word line $WL_3$; and character $Q_{S64}$ indicates a switching MISFET which has its one end portion connected with the signal line $\phi_2$ and its other end portion connected with the word line $WL_4$, thus constructing together the input portion and the output portion of the X-decoder II 6. By the X-decoder II 6 resorting to the simple switching means, as in the above, one of the word lines WL is selected and connected electrically with the signal lines $\phi$ which are arranged to correspond to those word lines.

In order to reduce the "ON" resistance of each of the switching MISFETs ($Q_{S50}$, $Q_{\overline{S50}}$, $Q_{T51}$, $Q_{T52}$, $Q_{S61}$ to $Q_{S64}$), the cutting MISFETs $Q_C$ are disposed in both the decoders X-Dec I and X-Dec II. Specifically, when the signal line 45 of the X-Dec II is raised to a high level, the gate potential of the switching MISFET $Q_{S61}$ is raised to the high level through the cutting MISFET $Q_C$ between the line 45 and the MISFET $Q_{S61}$, and the inversion region (or channel region) is induced to the channel forming region of the MISFET $Q_{S61}$. The gate capacitance between the gate electrode and the inversion region of the MISFET $Q_{S61}$ acts as a so-called self bootstrap capacitance. Therefore, when the signal $\phi_1$ is raised to the high level, the gate potential of the MISFET is raised to a boosted high level. At that time, the cutting MISFET $Q_C$ is cut off automatically. It should be noted, however, that the cutting MISFETs $Q_C$ are not essential to this invention since logical operations of the decoders are satisfied without the cutting MISFETs.

Next, the X-decoder I, X-decoder II and memory arrays will be described in the following in connection with the specific constructions thereof.

Figure 3:
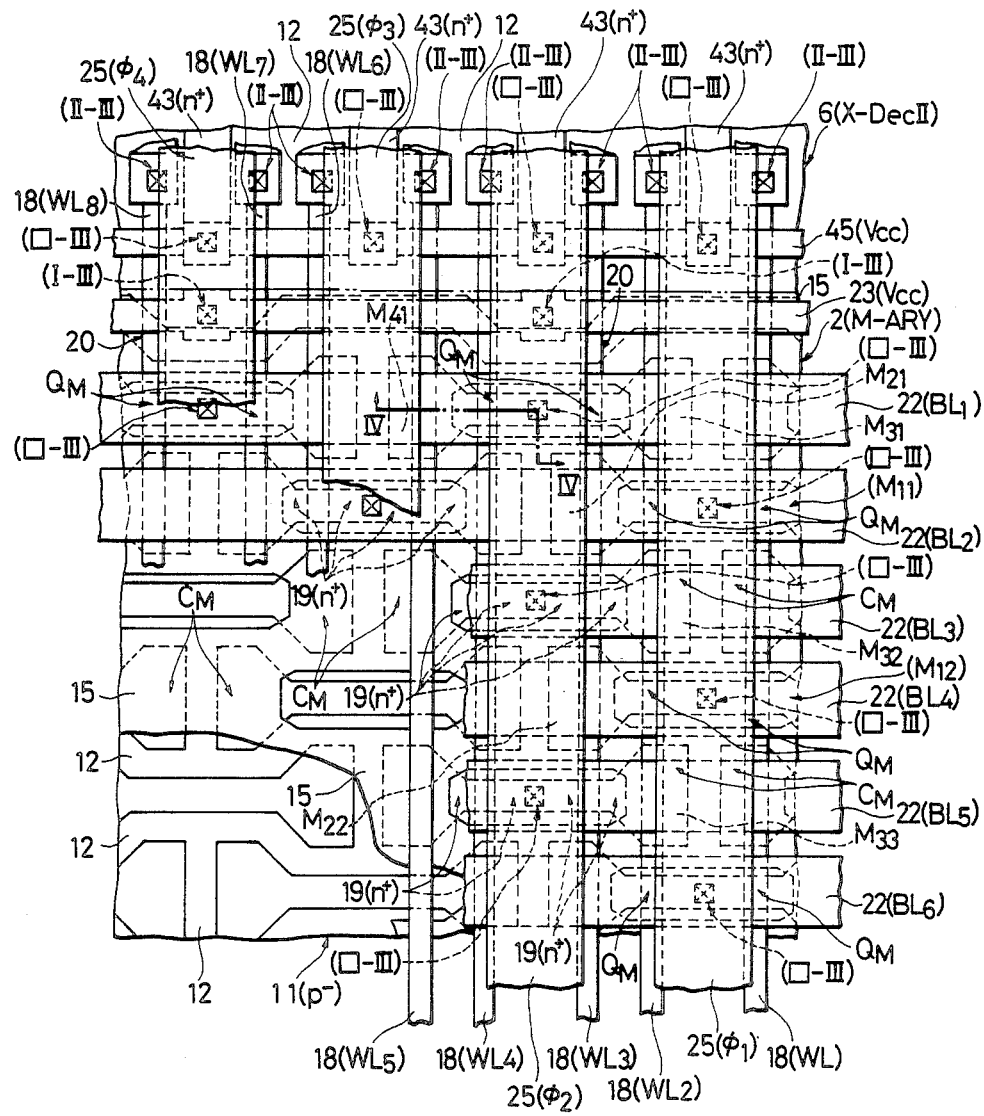
FIG. 3 is a top plan view showing the essential portion of the memory cell arrays for explaining the embodiment I of the present invention.
Figure 3A:
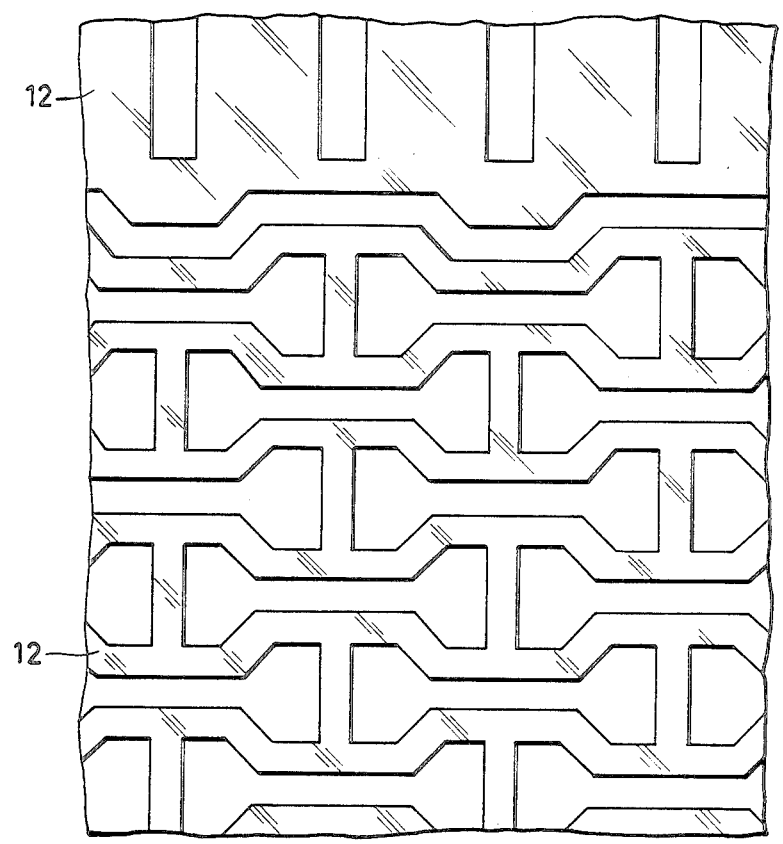
FIGS. 3A to 3D illustrate steps in the formation of FIG. 3.
Figure 3B:
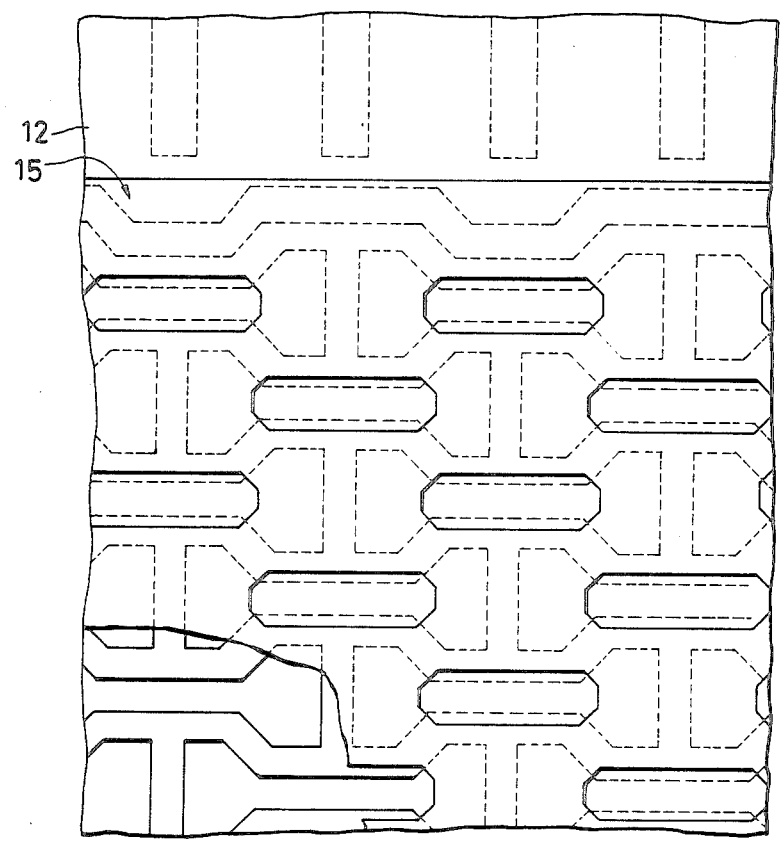
Figure 3C:
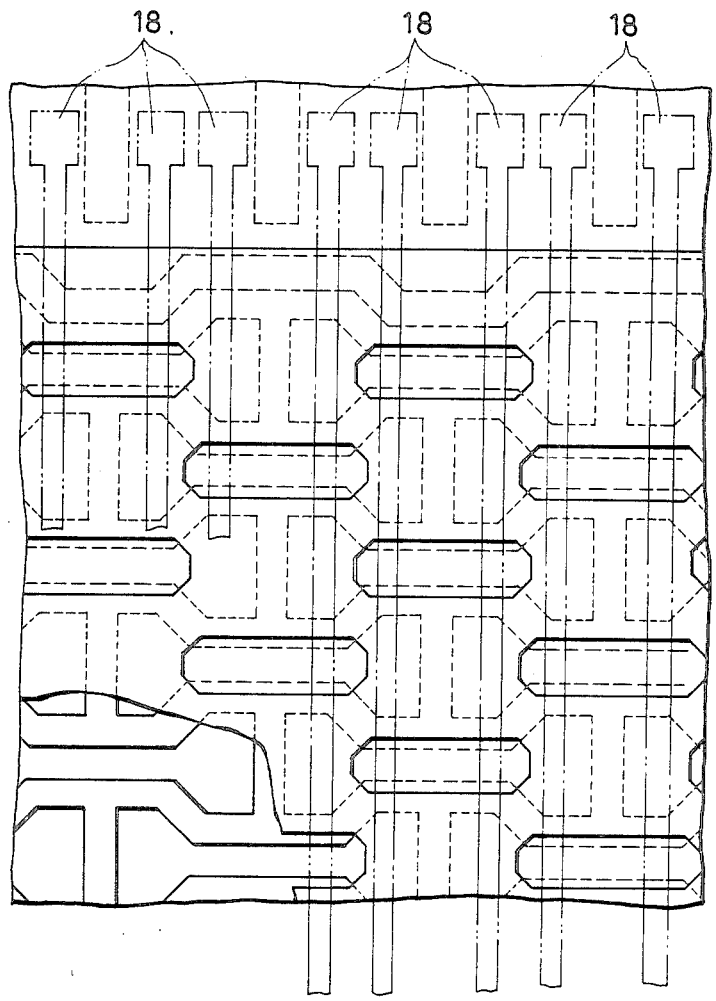
Figure 3D:
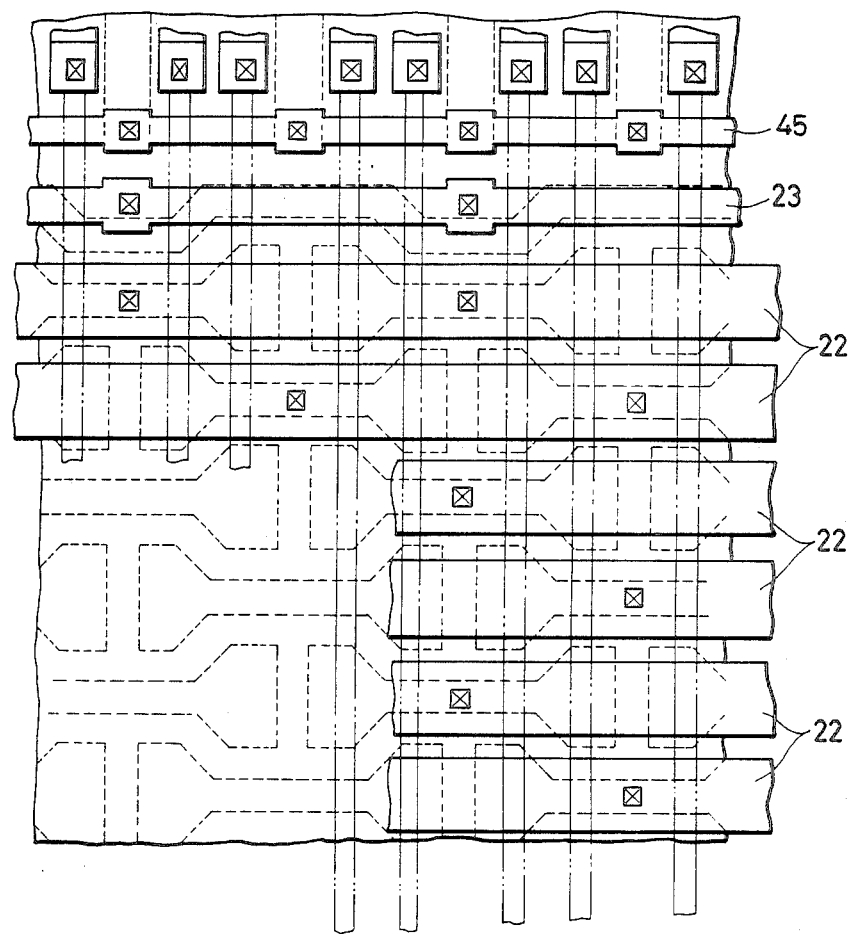
Figure 4:
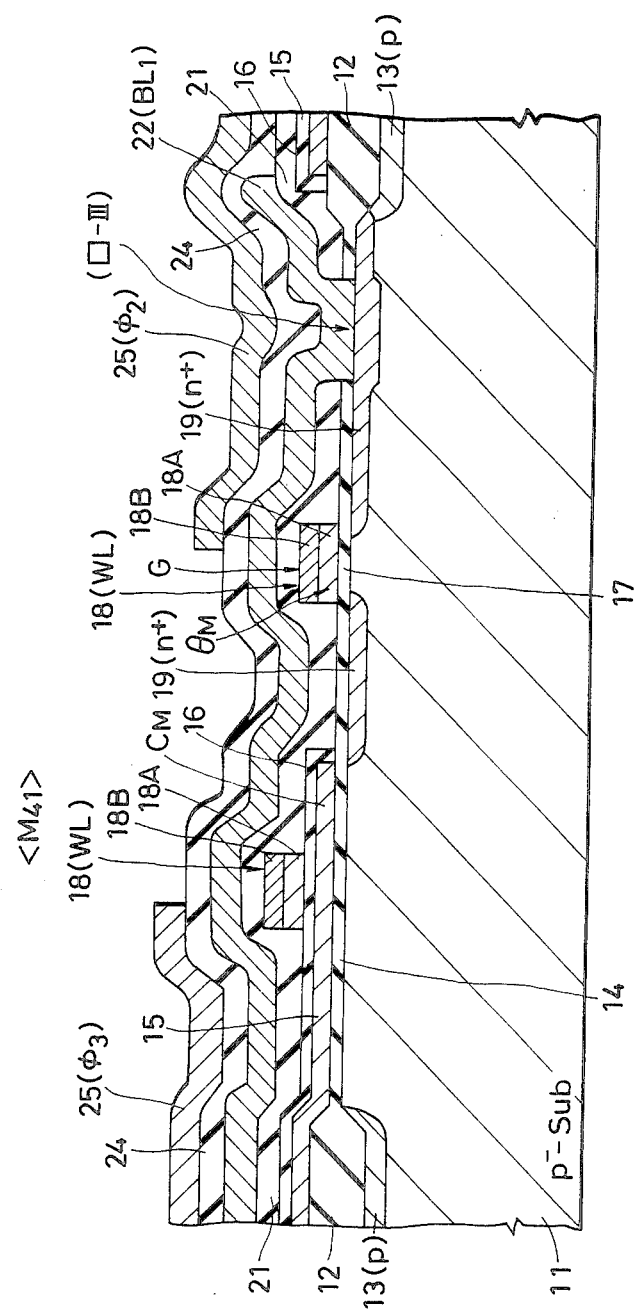
FIG. 4 is a sectional view showing the essential portion and taken along line IV—IV of FIG. 3.

FIG. 3 is a top plan view showing an essential portion of the memory cell arrays for explaining the embodiment I of the present invention, and FIG. 4 is a sectional view showing the essential portion and taken along line IV—IV of FIG. 3. Incidentally, in the top plan views of FIG. 3 and FIGS. 5, 6 and 7, as appear hereinafter, the inter-layer insulating films to be formed between the individual conductive layers are not shown so that those figures may be seen better. FIGS. 3A to 3D illustrate steps in the formation of FIG. 3 in building the respective layers of the device, and materials used in these layers.

In FIGS. 3 and 4, reference numeral 11 indicates a $p^-$-type semiconductor substrate which is made of single-crystal silicon to construct the DRAM. Indicated at numeral 12 are field insulating films which are formed in the principal surface of the semiconductor substrate 11 between the regions to be formed with semiconductor elements such as the memory cells or MISFETs, thereby to isolate electrically the semiconductor elements. Those field insulating films 12 may be formed by the well-known LOCOS (i.e., Local Oxidation of Silicon) technique, and the full pattern of this film 12 is best seen in FIG. 3A. Numeral 13 is a p-type channel stopper region which is formed in the principal surface of the semiconductor substrate 11 under the field insulating films 12 thereby to isolate electrically the semiconductor elements. Numeral 14 indicates an insulating film (FIG. 4) which is formed in the principal surface of the semiconductor substrate in the regions to be formed with at least the capacity elements of the memory cells and the capacity elements (although not shown) of the dummy cells, thereby to construct the capacity elements. Numeral 15 indicates a conductive plate which is formed above the insulating film 14 and the field insulating film 12 in the regions to be formed with the memory cell arrays 2 other than the regions to be formed with the MISFETs of the memory cells, thereby to construct the capacity elements of the memory cells and the dummy cells. That conductive plate 15 is made of the first conductive layer (which will be called "I-CL" (i.e., Conductor Layer)) of the DRAM fabrication process and may be made of a polycrystalline silicon film, for example (see FIG. 3B). The capacity element $C_M$ of the memory cell is formed in its corresponding region of the semiconductor substrate 11, the insulating film 14 and the conductive plate 15. Numeral 16 indicates an insulating film (FIG. 4) which is formed to cover the conductive plate 15 thereby to isolate electrically the second conductive layer (which will be called "II-CL") of a later-described DRAM fabrication process. Numeral 17 indicates an insulating film which is formed in the principal surface of the semiconductor substrate 11 in the region to be formed with the MISFET other than the conductive plate 15 and in the regions of the X-decoder I 5 and the X-decoder II 6 to be formed with the MISFET. The insulating film 17 is used to form mainly the gate insulating film of the MISFET. Indicated at numeral 18 are word lines which extend at a predetermined pitch in the column direction above the insulating films 16 and 17 of the memory cell arrays 2 thereby to turn "ON" or "OFF" the MISFETs acting as the switching elements of the memory cells (see FIG. 3C). Those word lines 18 are adapted to construct the gate electrodes G of the MISFETs in the regions to be formed with the memory cells. Each word line 18 is constructed of the II-CL and may be constructed of, for example, a polycrystalline silicon film 18A and a silicide film 18B of molybdenum silicide ($MoSi_2$) or tantalum silicide ($TaSi_2$) having a lower specific resistance than the polycrystalline silicon film 18A. Numeral 19 indicates an $n^+$-type semiconductor region which is formed in the principal surface of the semiconductor substrate 11 in such regions at both sides of the word lines 18 as are to be formed with the MISFETs acting as the gate electrodes G. The semiconductor region 19 is used as the source region and the drain region to construct the MISFETs of the memory cells. The semiconductor region 19 may be made by the ion implantation technique of an impurity such as arsenic ions. The MISFETs $Q_M$ acting as the switching elements of the memory cells are constructed of the gate electrodes G (i.e., the word lines 18), the insulating film 17 and the semiconductor region 19. Moreover, the memory cell M is constructed of a series connection of the MISFET $Q_M$ and the capacity element $C_M$. Incidentally, numeral 20 indicates a guard ring region which is formed of the field insulating film 12 in the principal surface of the semiconductor substrate 11 in a manner to surround the memory cell arrays 2. The guard ring region 20 prevents the unnecessary minority carriers, which will be generated outside of the memory cell arrays 2, from migrating thereinto. Numeral 21 indicates an insulating film which is formed over the II-CL to isolate electrically the II-CL from a third conductive layer (which will be called "III-CL") of the DRAM fabrication process. The insulating film 21 may be made of a phosphosilicate glass (PSG) film to retard growth of the undulations due to the multi-layered wiring by the glass flow. Letters (☐-III) indicate connection holes which are formed by selectively removing the insulating film 17 and 21 over the predetermined semiconductor region 19 thereby to connect electrically said semiconductor region 19 with the wires which are formed by a later-described conductive layer III-CL. Letters (I-III) indicate connection holes which are formed by selectively removing the insulating films 16 and 21 over the predetermined portion of the conductive plate 15 made of the conductive layer I-CL to connect the predetermined portion of said conductive plate 15 electrically with the wires which are formed by a later-described conductive layer III-CL. Indicated at numeral 22 are bit lines (i.e., BL) which extend at a predetermined pitch and in the row direction over the insulating film 21 of the memory cell arrays 2 and which are connected electrically through the connection holes (☐-III) with the predetermined semiconductor region 19 of the memory cells M arranged in the row direction. The bit lines 22 are made of the conductive layer III-CL and may be made of an aluminum film, for example (see FIG. 3D). Indicated at numeral 23 are wires which are formed above the end portions of the conductive plate 15 to extend in the row direction through the insulating films 16 and 21. The wires 23 are made of the conductive layer III-CL and are connected with the voltage terminals $V_{CC}$. The wires 23 are connected electrically with the predetermined portions of the conductive plate 15 through the connection holes (I-III). Numeral 24 indicates an insulating film which is formed over the conductive layer III-CL thereby to isolate electrically the conductive layer III-CL from a fourth conductive layer (which will be called "IV-CL") of the DRAM fabrication process. Indicated at numeral 25 are signal lines $\phi$ which are formed over the insulating film 24 of the memory cell arrays 2 to extend at a predetermined pitch in the column direction and which have their one-end portions connected with the output portion of the X-decoder I 5 and their other end portions connected with the input portion of the X-decoder II 6. Those signal lines 25 are provided by one for every two word lines 18 and are made of a conductive layer IV-CL such as an aluminum film. By providing one signal line 25 for two word lines 18, moreover, the design rule of the conductive layer IV-CL can be loosened to reduce the working inferiorities so that the reliability of the DRAM can be improved. Moreover, the pitch between the signal lines 25 adjoining in the row direction can become surplus space to retain the widthwise size of the signal lines 25 sufficient so that the signal lines can have their sectional area increased to reduce their resistance.

Figure 5:
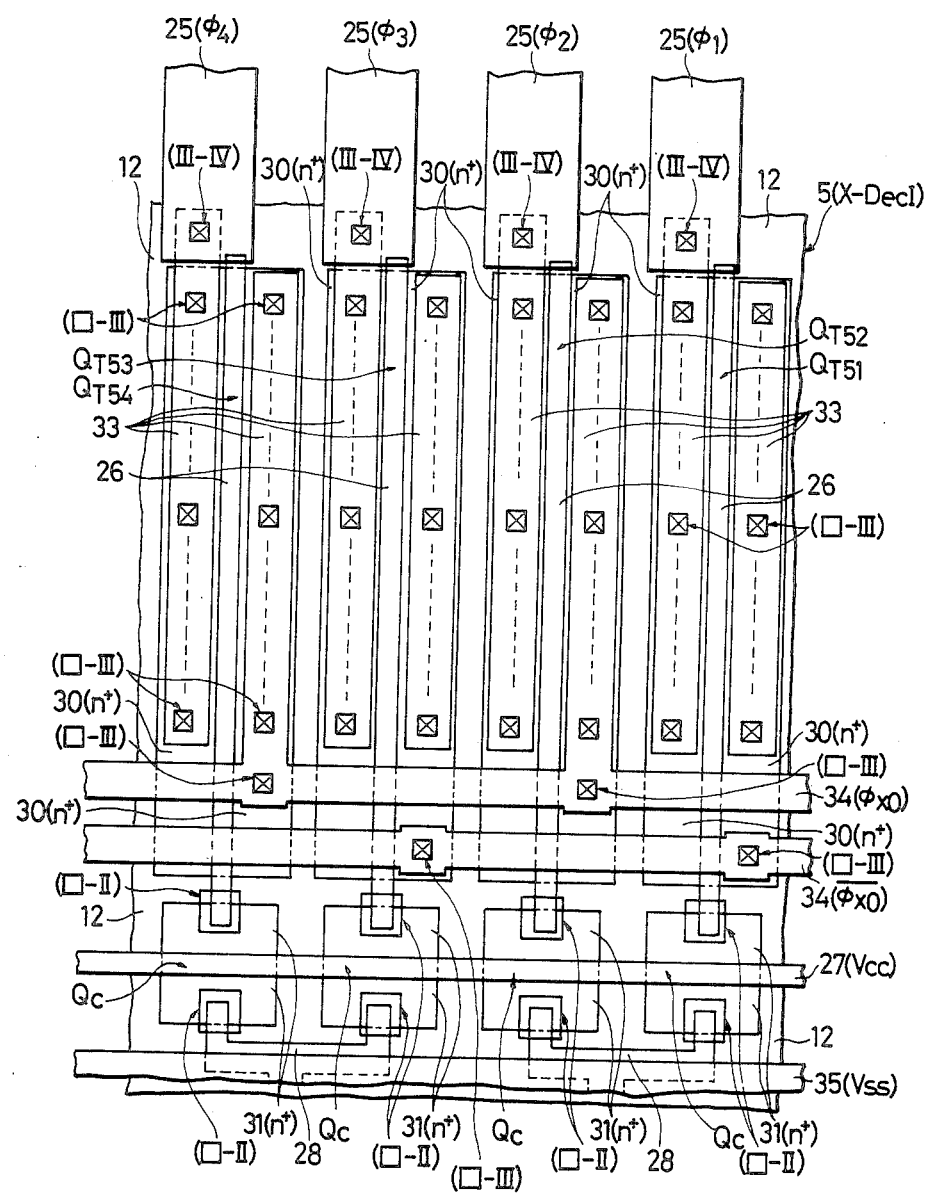
FIGS. 5 and 6 are top plan views showing the essential portions of the X-decoder I for explaining the embodiment I of the present invention.
Figure 5A:
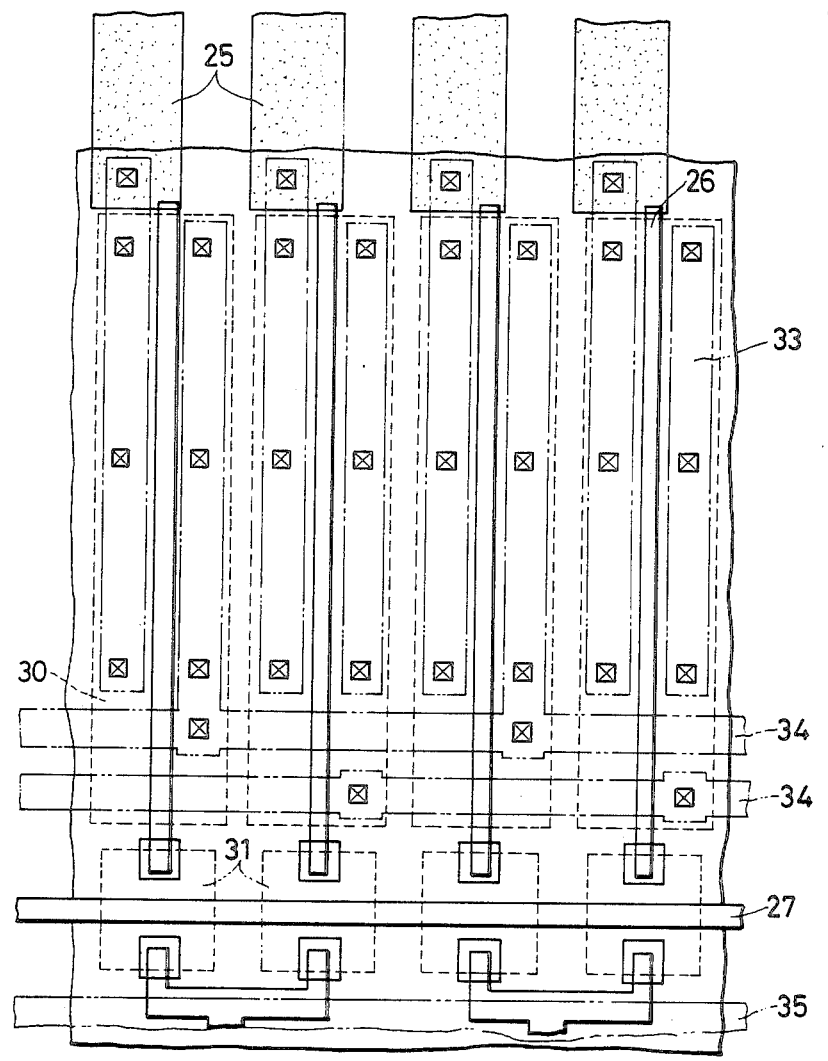
FIGS. 5A and 6A are views corresponding to FIGS. 5 and 6 showing the material used for the various layers.
Figure 6:
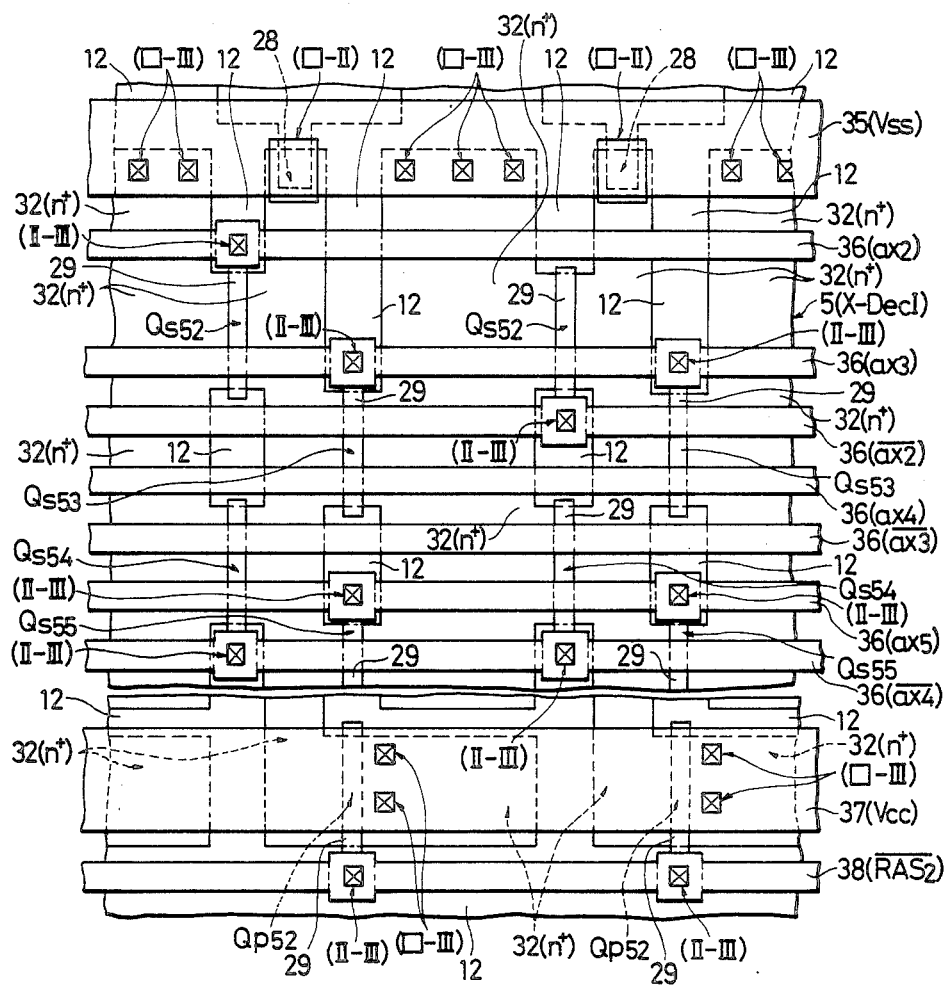
Figure 6A:
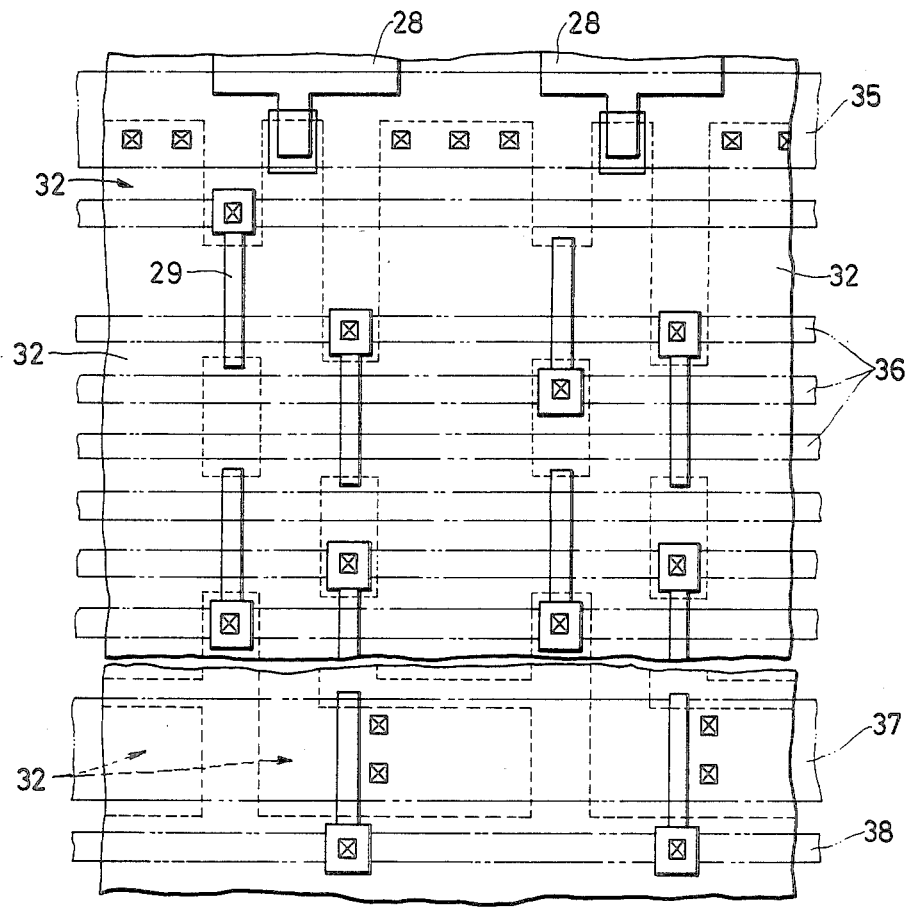
Figure 11:
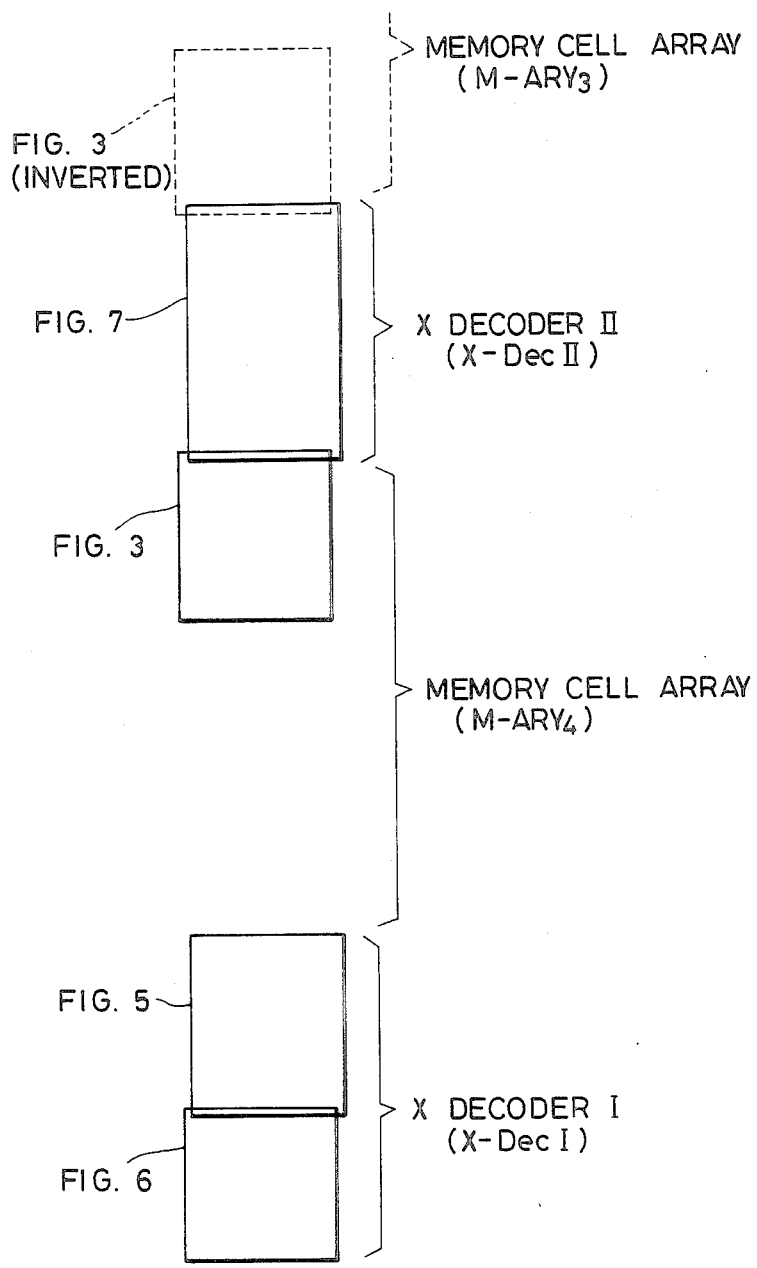
FIG. 11 is a layout illustration of the relationships between FIGS. 3, 5, 6 and 7.

FIGS. 5 and 6 are top plan views showing the essential portions of the X-decoder I 5 for explaining the embodiment I of the present invention. FIG. 5 shows a portion of the decoder 5 which couples to the signal lines $\phi$ (i.e., 25) while FIG. 6 shows a portion of the decoder 5 having the switching and precharging transistors. FIGS. 5A and 6A correspond to FIGS. 5 and 6 but include legends to indicate the respective materials used to form the various layers. FIGS. 5 and 6 are related to one another as shown in FIG. 11.

Indicated at numeral 26 in FIG. 5 are gate electrodes which extend in the column direction over the insulating film 17 (although not shown) in regions to be formed with the transfer MISFETs $Q_T$, thereby to construct the MISFETs $Q_T$. Those gate electrodes 26 are made of the conductive layer II-CL. Moreover, the gate electrodes 26 have their one-end portions extending and connected electrically directly with one semiconductor region, which is used as the source region or the drain region of another MISFET ($Q_C$), through connection holes (□-II) formed in the insulating film 17. Indicated at numeral 27 are wires which are formed to extend in the row direction over the insulating film 17 (although not shown) in the regions to be formed with the plural cutting MISFETs $Q_C$ and over the field insulating film 12 in between thereby to construct the gate electrodes in the region to be formed with the MISFETs $Q_C$. Those wires 27 are made of the conductive layer II-CL and are connected with the voltage terminals $V_{CC}$. Indicated at numeral 28 are wires which have their one-end portions connected electrically through the connection holes (□-II) with the other semiconductor region of the two MISFETs ($Q_C$) and their other end portions connected electrically through the connection holes (□-II) with one semiconductor region common of the plural MISFETs ($Q_{S2}$ to $Q_{S58}$), thereby to provide their electrical connections. Those wires 28 are made of the conductive layer II-CL. Indicated at numeral 29 are a plurality of gate electrodes which extend in the column direction over the insulating film 17 (although not shown) in the regions to be formed with switching MISFETs $Q_S$ and precharging MISFETs $Q_P$, thereby to construct the MISFETs $Q_S$ and $Q_P$. Those gate electrodes 29 are made of the conductive layer II-CL. Numeral 30 indicates an n+-type semiconductor region which is formed in the principal surface of the semiconductor substrate 11 at both the side portions of the gate electrodes 26 in the regions to be formed with the MISFETs $Q_T$. The semiconductor region 30 is used as the source region or the drain region to construct the MISFETs $Q_T$. These transfer MISFETs $Q_T$ are formed of the gate electrodes 26, the insulating film 17 (although not shown) and the semiconductor region 30. Numeral 31 indicates an n+-type semiconductor region which is formed in the principal surface of the semiconductor substrate 11 at both the side portions of the wires (i.e., the gate electrodes) 27 in the regions to be formed with the MISFETs $Q_C$. The semiconductor region 31 is used as the source region or the drain region to construct the MISFETs $Q_C$. These cutting MISFETs $Q_C$ are constructed of the wires (i.e., the gate electrodes) 27, the insulating film 17 (although not shown) and the semiconductor region 31.

In FIG. 6, numeral 32 indicates an n+-type semiconductor region which is formed in the principal surface of the semiconductor substrate 11 at both the side portions of the gate electrodes 29 in the regions to be formed with the MISFETs $Q_S$ and $Q_P$, thereby to construct these MISFETs $Q_S$ and $Q_P$. These semiconductor regions 32 are constructed integrally with the source regions or the drain regions of the MISFETs $Q_S$ in the column direction and commonly to the source regions or the drain regions of the MISFETs $Q_S$ in the row direction. The switching MISFETs $Q_S$ are formed of the gate electrodes 29, the insulating film 17 (although not shown) and the semiconductor region 32. The precharging MISFETs $Q_P$ are formed of the gate electrodes 29, the insulating film 17 (although not shown) and the semiconductor region 32. Incidentally, the precharging MISFETs $Q_P$ may construct the p-channel precharging MISFETs $Q_P$ by forming an n-type well region covering them in the principal surface of the semiconductor substrate 11 and by forming such a p+-type semiconductor region in the principal surface portion of the aforementioned well region as is used as the source region or the drain region, thereby to construct complementary MISFETs (which will be shortly referred to as "CMIS") together with n-channel MISFETs $Q_S$.

Indicated at numeral 33 (FIG. 5) are shunts which are formed over the semiconductor regions 30 of the MISFETs $Q_T$ through the insulating film 21 and which are connected electrically with the semiconductor regions 30 through the plural connection holes (□-III). Those shunts 33 are made of the conductive layer III-CL to reduce the substantial resistance of the semiconductor regions 30. Indicated at numeral 34 (FIG. 5) are wires which extend in the row direction over the predetermined insulating film 21 (although not shown) and to which the decoded selecting timing signals $\phi_{x0}$ and $\overline{\phi}_{x0}$ are transmitted through the switching MISFETs $Q_{\overline{S50}}$ and $Q_{\overline{S50}}$. Those wires 34 are made of the conductive layer III-CL and are connected electrically through the connection holes (□-III) with one semiconductor region 30 of a predetermined MISFET $Q_T$. From the standpoint of layout, incidentally, the predetermined ones of the shunts 33 and the predetermined ones of the wires 34 are integrated.

Indicated at numeral 35 (FIGS. 5 and 6) are wires which are formed to extend in the row direction over the predetermined insulating film 21 (although not shown) and which are connected with voltage terminals $V_{SS}$ (at the ground potential). Those wires 35 are made of the conductive layer III-CL and are connected electrically with the predetermined semiconductor region 32 through the plural connection holes (□-III). Indicated at numeral 36 (FIG. 6) are a plurality of wires which extend in the row direction over the predetermined insulating film 21 (although not shown) in the regions to be formed with the MISFET $Q_S$ and which are connected with the address signal terminals $a_x$ and $\overline{a_x}$, respectively. Those wires 36 are made of the conductive layer III-CL and are connected electrically with the predetermined gate electrodes 29 through predetermined connection holes (II-III). Indicated at numeral 37 are wires which are formed to extend in the row direction over the predetermined insulating film 21 (although not shown) and which are connected with the voltage terminals $V_{CC}$. Those wires 37 are made of the conductive layer III-CL and are connected electrically with the predetermined semiconductor region 32 through the plural connection holes (□-III). Indicated at numeral 38 are wires which are formed to extend in the row direction over the predetermined insulating film 21 (although not shown) and which are connected with the precharging signal terminal $\overline{RAS_2}$. Those wires 38 are made of the conductive layer III-CL and are connected electrically with the predetermined gate electrodes 29 through the predetermined connection holes (II-III). The signal lines ($\phi$) 25 are connected electrically through the connection holes (□-III), the shunts 33 and connection holes (III-IV) with the other semiconductor region 30 of the MISFETs $Q_T$ acting as the output portion of the X-decoder I 5. The circuit elements for the X-decoder I 5, especially, the transfer MISFETs $Q_T$ may be provided to be connected with one signal line ($\phi$) 25 for two word lines (WL) 18 so that the area required for their arrangement can be sufficient. On the contrary, the area required for the transfer MISFETs $Q_T$ can be reduced so that the integration of the DRAM can be increased.

Figure 7:
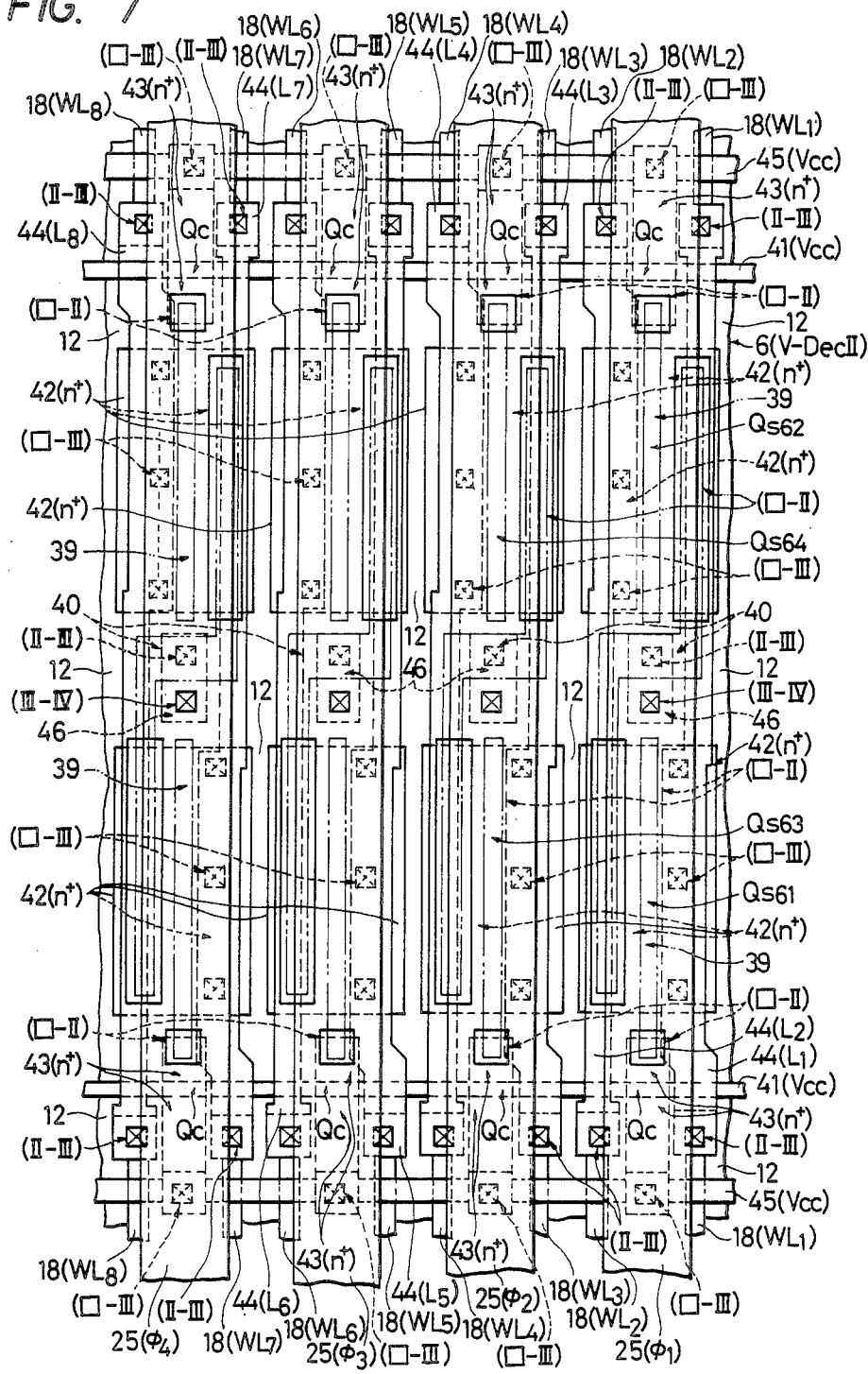
FIG. 7 is a top plan view showing the essential portion of the X-decoder II for explaining the embodiment I of the present invention and FIGS. 7A to 7D illustrate steps in the formation of FIG. 3.
Figure 7A:
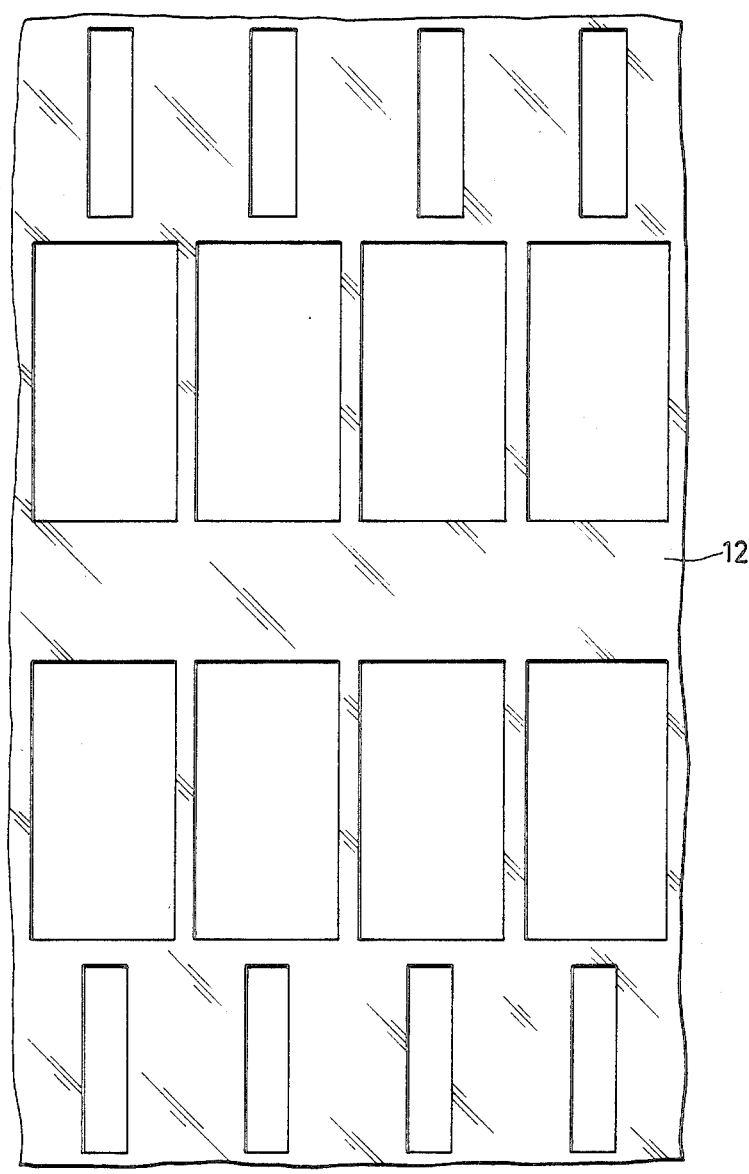
Figure 7B:
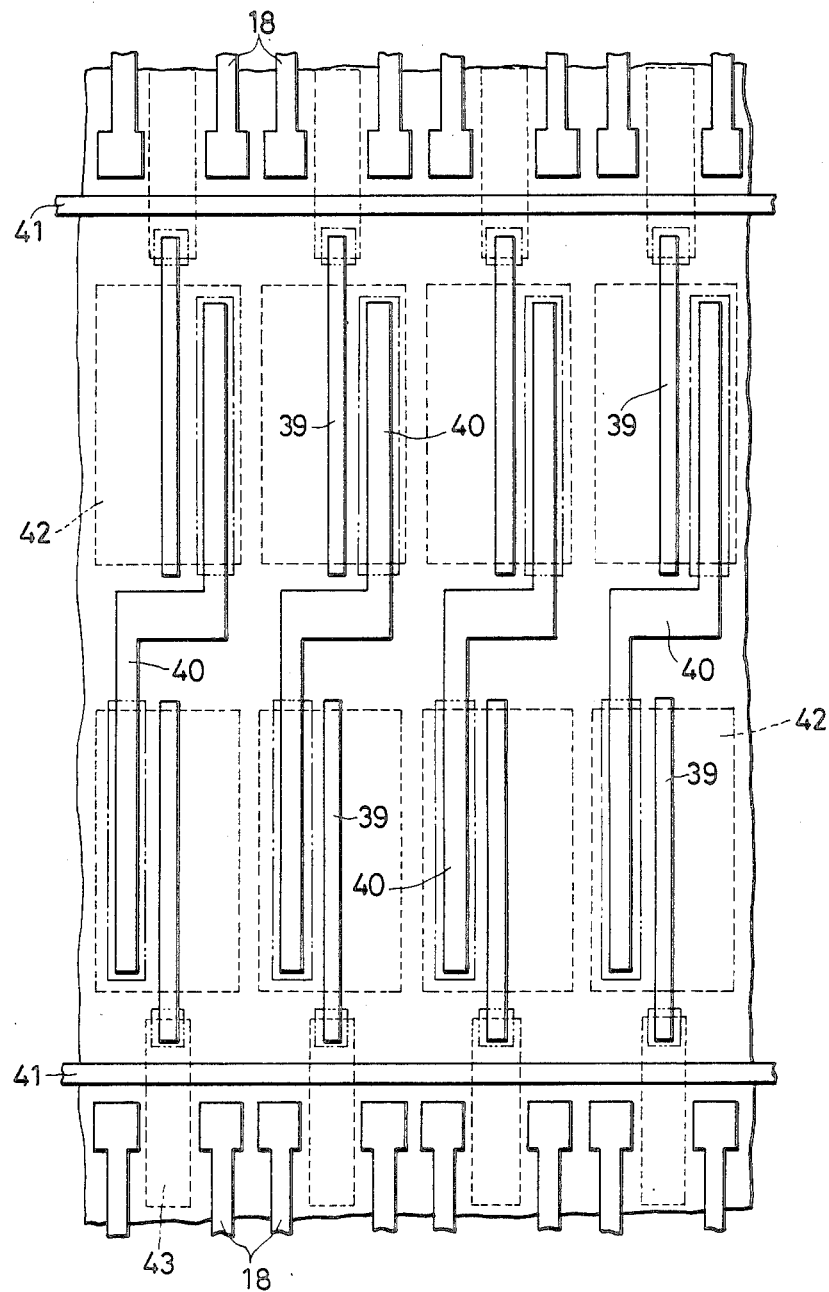

FIG. 7 is a top plan view showing the essential portion of the X-decoder II for explaining the embodiment I of the present invention. FIGS. 7A to 7D show steps in formation of FIG. 7 and materials used for the different layers.

Indicated at numeral 39 in FIG. 7 (see FIG. 7B) are gate electrodes which are formed to extend in the row direction over the insulating film 17 (although not shown) in the regions to be formed with the switching MISFETs $Q_S$, thereby to construct the MISFETs $Q_S$. Those gate electrodes 39 are made of the conductive layer II-CL. Moreover, the one-end portions of those gate electrodes 39 are extended and connected electrically by the connection holes (□-II) formed in the insulating film 17 directly with one semiconductor region of the other MISFET ($Q_C$). Indicated at numeral 40 are wires which are formed over the field insulating film 12 and which have their one-end portions connected electrically through the connection holes (□-II) with one semiconductor region of the MISFET $Q_S$ and their other end portion connected electrically through the connection holes (□-II) with one semiconductor region of the other MISFET $Q_S$ which is arranged in the column direction. Those wires 30 provide electrical connections between the MISFETs $Q_S$ which are arranged in the column direction. Those wires 40 are made of the conductive layer II-CL. As will be described hereinafter, moreover, those wires 40 are connected electrically with the predetermined signal lines ($\phi$) 25 through the intermediate conductive members, which are made of the conductive layer III-CL, thereby to input the output signals, which are outputted from the output portion of the X-decoder I 5, to the input portion of the X-decoder II 6. Indicated at numeral 41 are wires which are formed to extend in the row direction over the insulating film 17 (although not shown) in the regions to be formed with the plural cutting MISFET $Q_C$ and over the intervening field insulating film 12, thereby to construct the gate electrodes in the MISFET $Q_C$ forming regions. Those wires 41 are made of the conductive layer II-CL and are connected with the voltage terminals $V_{CC}$. Numeral 42 indicates an n+-type semiconductor region which is formed in the principal surface portion of the semiconductor substrate at both the side portions of the gate electrodes 39 in the regions to be formed with the MISFETs $Q_S$. The semiconductor region 42 is used as the source region or the drain region to construct the MISFETs $Q_S$ which act as the input portion and the output portion of the X-decoder II 6. Those switching MISFETs $Q_S$ are constructed of the gate electrodes 39, the insulating film 17 (although not shown) and the semiconductor region 42. Indicated at numeral 43 are n+-type semiconductor regions which are formed in the principal plane portion of the semiconductor substrate 11 at both the side portions of the wires (i.e., the gate electrodes) 41 in the regions to be formed with the MISFETs $Q_C$. The semiconductor regions 43 are used as the source region or the drain region to construct the MISFETs $Q_C$. These cutting MISFETs $Q_C$ are constructed of the wires (i.e., the gate electrodes) 41, the insulating film 17 (although not shown) and the semiconductor regions 43.

Figure 7C:
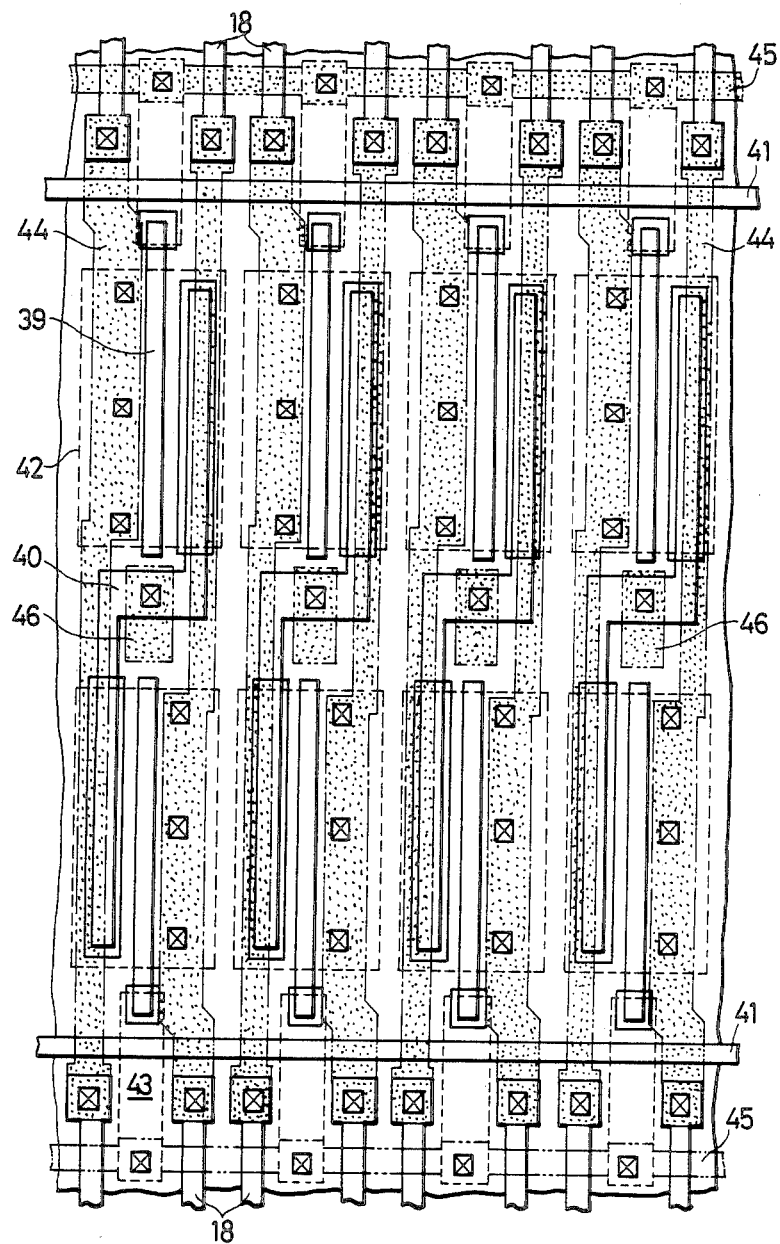
Figure 7D:
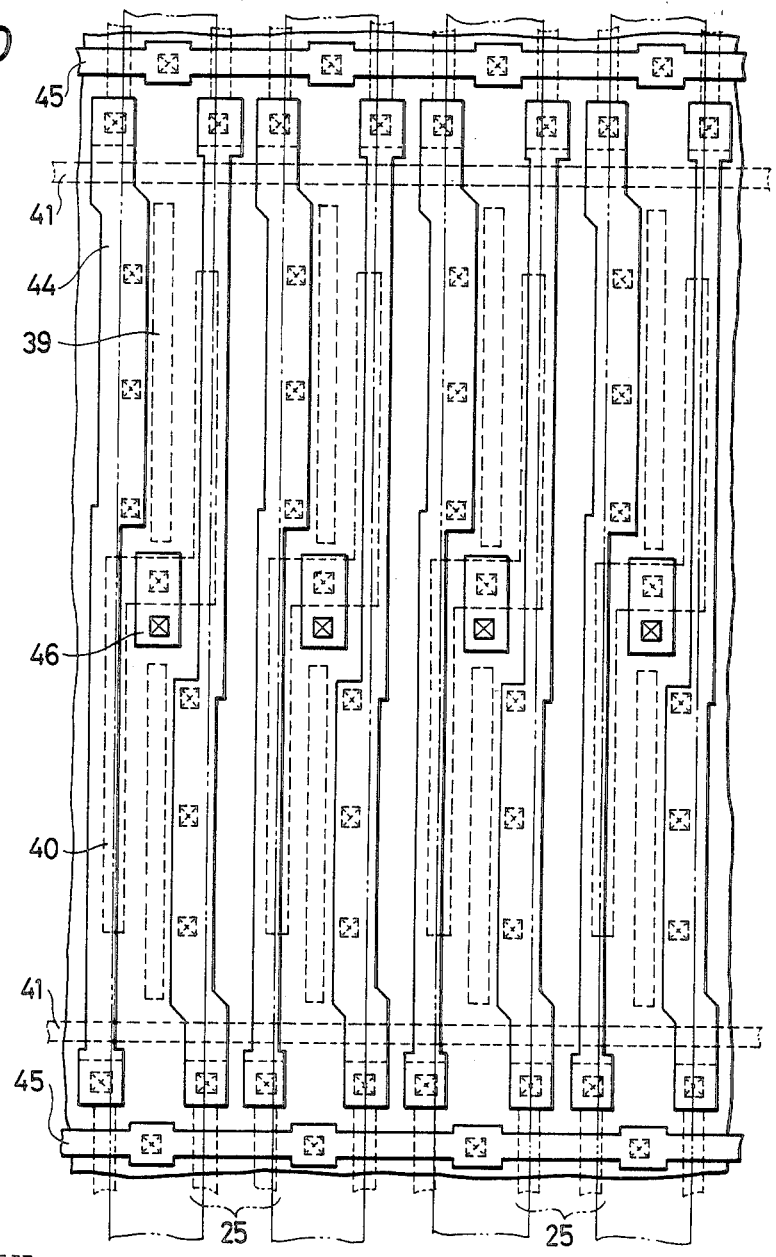

In FIG. 7 and FIG. 7C, numeral 44 shows wires which are formed to extend in the column direction over the insulating film 21 (although not shown) and which have their one-end portions connected electrically through the connection holes (II-III) with the predetermined word lines (WL) 18 formed in the memory cell arrays 2 and their other end portions connected electrically with the connection holes (II-III) with the predetermined word lines (WL) 18 formed in other memory cell arrays 2 arranged in the column direction. Those wires 44 are connected electrically by the plural connection holes (□-III) with the other semiconductor region 42 acting as the predetermined MISFETs $Q_S$, i.e., the output portion of the X-decoder II 6. The wires 44 are made of the conductive layer III-CL and adapted to connect electrically the output portion of the X-decoder II 6 and the predetermined word lines (WL) 18 of the memory cell arrays 2 and to connect electrically the individual word lines (WL) 18 of the memory cell arrays 2 constructing the memory cell array columns. Indicated at numeral 45 are wires which are formed to extend in the row direction over the insulating film 21 (although not shown) on the predetermined semiconductor regions 43 and the field insulating film 12. The wires 45 are connected through the decoder (e.g., the MISFETs ($Q_{P61}$, $Q_{S60}$, $Q_{P62}$ and $Q_{\overline{S60}}$)) of the X-decoder II 6 with both the voltage terminals $V_{CC}$ and the ground potential terminals $V_{SS}$ of the circuit (as shown in FIG. 2). Those wires 45 are made of the conductive layer III-CL and are connected electrically through the connection holes (□-III) with the other semiconductor region of the predetermined MISFETs $Q_C$. Indicated at numeral 46 are intermediate conductive members which have their one-end portions connected electrically through the connection holes (II-III) with the predetermined portions of the wires 40 and their other end portions connected electrically through the connection holes (III-IV) with the signal lines ($\phi$) 25 extending in the column direction over the X-decoder II 6. The intermediate conductive members 46 are adapted to provide those electrical connections. The conductive members 46 are made of the conductive layer III-CL to improve the reliability of the electrical connections between the wires 40 and the signal lines ($\phi$) 25.

Since the signal lines ($\phi$) 25 are made of the conductive layer IV-CL, as has been described hereinbefore, the resistance from the output portion of the X-decoder I 5 to the input portion of the X-decoder II 6 can be reduced to a sufficiently low value. Since the mat system is adopted and since the word lines (WL) 18 arranged in the memory cell arrays 2 are shortened, moreover, it is possible to get a rise of the signal of the word lines (WL) 18 selected sufficiently. As a result, the time period for the data writing and reading operations of the DRAM can be shortened to speed up the operations. Still moreover, since it is sufficient to provide one signal line ($\phi$) 25 for two word lines (WL) 18 because of the provision of the X-decoder II 6, the design rule can be loosened to prevent the working inferiorites so that the DRAM can be speeded up to improve its reliability.

In case the mat system is adopted, on the other hand, the "X-decoder" constructed of the X-decoder I 5 and the X-decoder II 6 is usually arranged in each portion where the X-decoder II 6 is arranged.

In the DRAM according to the present embodiment, however, the overlapped surplus X-decoder I 5 can be eliminated by connecting one X-decoder I 5 and the plural X-decoders II 6 through the common signal lines ($\phi$) 25. As a result, the integration of the DRAM can be improved according to the present embodiment.

Next, the specific operations of the present embodiment will be described briefly with reference to FIGS. 2 to 7. Here, the operations of the present embodiment will be explained in connection with the operations to read out the data from a memory cell $M_{41}$ which is arranged in the memory cell array 2.

At first, the address signal terminals $a_{x0}$ and $\overline{a_{x0}}$ of the X-decoder II 6 are set at the "Low" level, and the switching MISFETs $Q_{S60}$ and $Q_{\overline{S60}}$ are turned "OFF". Generally simultaneously with this, the address signal terminals $a_{x1}$, $\overline{a_{x1}}$, $\overline{a_{x2}}$, $a_{x3}$, $\overline{a_{x4}}$, $a_{x5}$, $\overline{a_{x6}}$, $a_{x7}$ and $\overline{a_{x8}}$ of the X-decoder I 5 are set at the "Low" level, and the switching MISFETs $Q_{S51}$, $Q_{\overline{S51}}$, $Q_{S52}$, $Q_{S53}$, $Q_{S54}$, $Q_{S55}$, $Q_{S56}$, $Q_{S57}$ and $Q_{S58}$ are turned "OFF". And, the precharging signal terminals $\overline{RAS_2}$ of the X-decoder I 5 and the X-decoder II 6 are set at the "High" level. As a result, in the X-decoder I 5, the precharging MISFET $Q_{P52}$ is turned "ON", whereupon the voltage from the voltage terminals $V_{CC}$ is applied to precharge the predetermined semiconductor region 32 to the "High" level so that the transfer MISFETs $Q_{T51}$ and $Q_{T52}$ are turned "ON". Generally simultaneously with this, in the X-decoder I 5, the precharging MISFETs $Q_{P51}$ and $Q_{\overline{P51}}$ are turned "ON", whereupon the voltage from the voltage terminals $V_{CC}$ is applied to precharge the predetermined wires to the "High" level so that the switching MISFETs $Q_{S50}$ and $Q_{\overline{S50}}$ are turned "ON". Generally simultaneously with this, moreover, in the X-decoder II 6, the precharging MISFETs $Q_{P61}$ and $Q_{P62}$ are turned "ON", whereupon the voltage from the voltage terminals $V_{CC}$ is applied to precharge the wires 45 to the "High" level so that the switching MISFETs $Q_{S61}$, $Q_{S62}$, $Q_{S63}$ and $Q_{S64}$ are turned "ON". And, the precharging signal terminals $\overline{RAS_2}$ of the X-decoder I 5 and the X-decoder II 6 are set at the "Low" level, and the precharging MISFETs $Q_{P51}$, $Q_{\overline{P51}}$, $Q_{P61}$ and $Q_{P62}$ are turned "OFF" so that the precharged wires or semiconductor regions are held at the "High" level.

In parallel with this, on the other hand, the bit lines ($BL_1$) 22 of the memory cell array 2 is precharged to and held at the "High" level.

After that, in the X-decoder II 6, the address signal terminal $a_{x0}$ takes the "Low" level so that the switching MISFET $Q_{S60}$ is continuously turned "OFF". As a result, the switching MISFETs $Q_{S62}$ and $Q_{S64}$ are held in the "ON" state, and the address signal terminal $\overline{a_{x0}}$ takes the "High" level so that the switching MISFET $Q_{\overline{S60}}$ is turned "ON". As a result, the wires 45 having been precharged to the "High" level are switched to the "Low" level, and the switching MISFETs $Q_{S61}$ and $S_{S63}$ are turned "OFF". Generally simultaneously with this, in the X-decoder I 5, the address signal terminal $a_{x1}$ takes the "Low" level, and the switching MISFET $Q_{S51}$ is continuously turned "OFF". As a result, the switching MISFET $Q_{S50}$ is held in the "ON" state to set the address signal terminal $\overline{a_{x1}}$ at the "High" level so that the switching MISFET $Q_{\overline{S51}}$ is turned "ON". As a result, the wires having been precharged to the "High" level are switched to the "Low" level, and the switching MISFET $Q_{\overline{S50}}$ is turned "OFF". Generally simultaneously with these, in the X-decoder I 5, the address signal terminals $\overline{a_{x2}}$, $a_{x3}$, $\overline{a_{x4}}$, $a_{x5}$, $\overline{a_{x6}}$, $a_{x7}$ and $\overline{a_{x8}}$ are set at the "Low" level, and the switching MISFETs $Q_{S52}$, $Q_{S53}$, $Q_{S54}$, $Q_{S55}$, $Q_{S56}$, $Q_{S57}$ and $Q_{S58}$ are continuously turned "OFF". As a result, the transfer MISFETs $Q_{T51}$ and $Q_{T52}$ are held in the "ON" states.

After that, the selecting timing signal is outputted from the selecting timing signal line $\phi_x$ of the X-decoder I 5 to the signal line ($\phi_2$) 25 through the switching MISFET $Q_{S50}$ and the transfer MISFET $Q_{T52}$ acting as the output portion of the X-decoder I 5. The output signal thus obtained is applied to the input portion of the selected switching MISFET $Q_{S64}$ acting as the input and output portions of the X-decoder II 6. The output signal thus applied is outputted through the switching MISFET $Q_{S64}$ to the predetermined word line (WL$_4$) 18. As a result, the word line (WL$_4$) 18 takes the "High" level so that all the MISFETs $Q_M$ of the memory cells connected with said word line (WL$_4$) 18 are turned "ON". To the bit line (BL$_1$) 22, moreover, there are outputted the data which is stored in the capacity element $C_M$ of the memory cell $M_{41}$. That is to say, the data is read out.

Incidentally, the operations to write the data in the memory cell $M_{41}$ are substantially similar to the reading operations and are omitted here.

Figure 8:
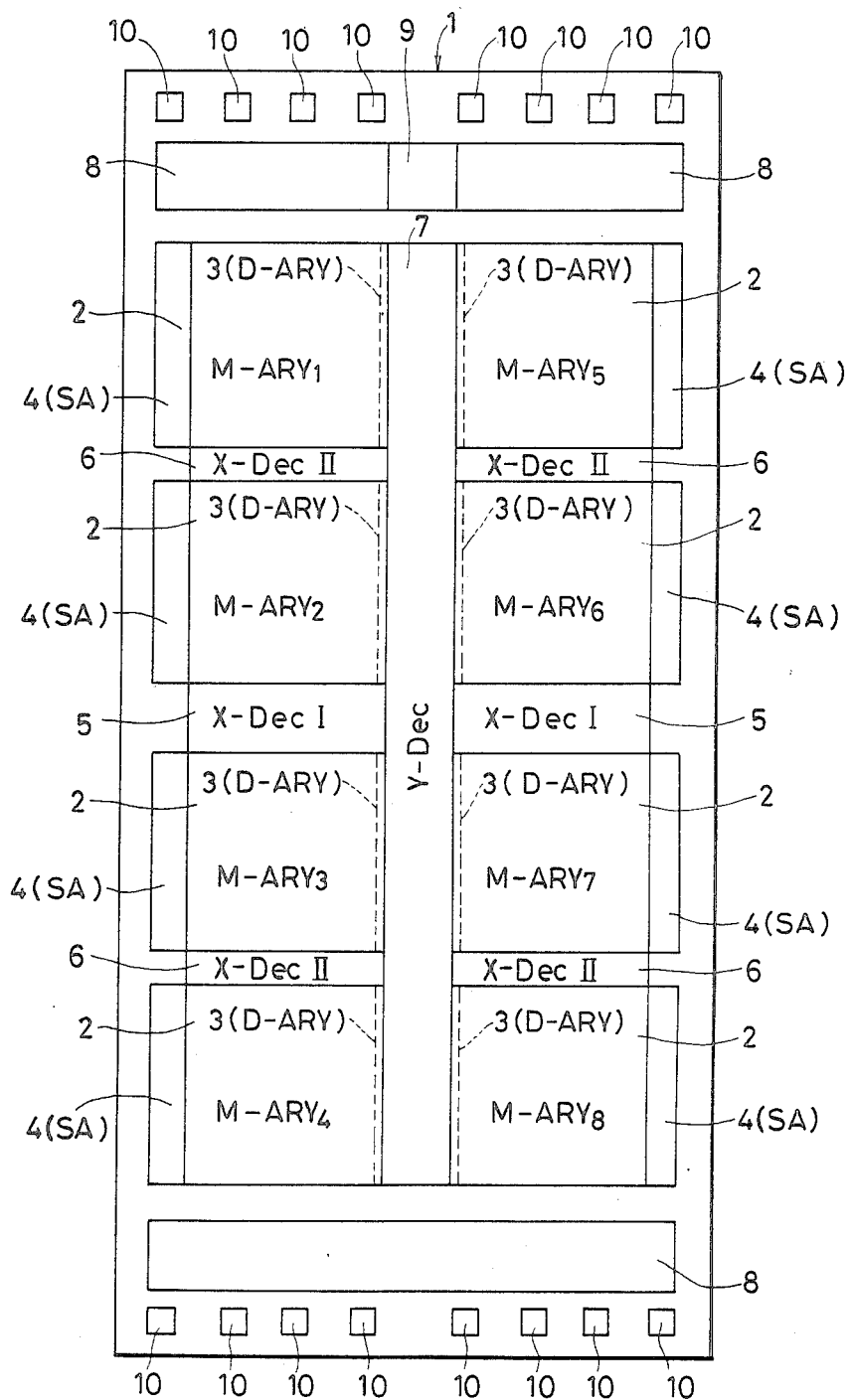
FIG. 8 is a schematic top plan view showing the DRAM for explaining the embodiment II of the present invention.

Embodiment II:

FIG. 8 is a schematic top plan view showing the layout pattern of the DRAM adopting the folded bit line construction for explaining the embodiment II of the present invention. The present embodiment will be described in connection with the DRAM which is of the eight mat type like the foregoing embodiment I.

In FIG. 8, the X-decoder I 5 is interposed between the memory cell arrays 2 which form the center portion of the memory cell array column. The X-decoder II 6 is interposed between the memory cell arrays which are located in positions other than the center portion of the memory cell array column.

According to the present embodiment, by disposing the X-decoder I 5 in the center portion of the memory cell array column, the distances between the plural X-decoders II 6 can be made uniform to shorten the time period for timing the operations of the X-decoders II 6. As a result, the operating speeds of writing and reading the data in and out of the DRAM can be improved. By disposing the X-decoder I 5 in the center portion of the memory cell array column, moreover, the output signals can be inputted to all the X-decoders II 6 from the signal lines ($\phi$) 25 which are shorter than those of the foregoing embodiment I. As a result, the operating speed of writing and reading the data in and out of the DRAM can be improved.

Figure 9:
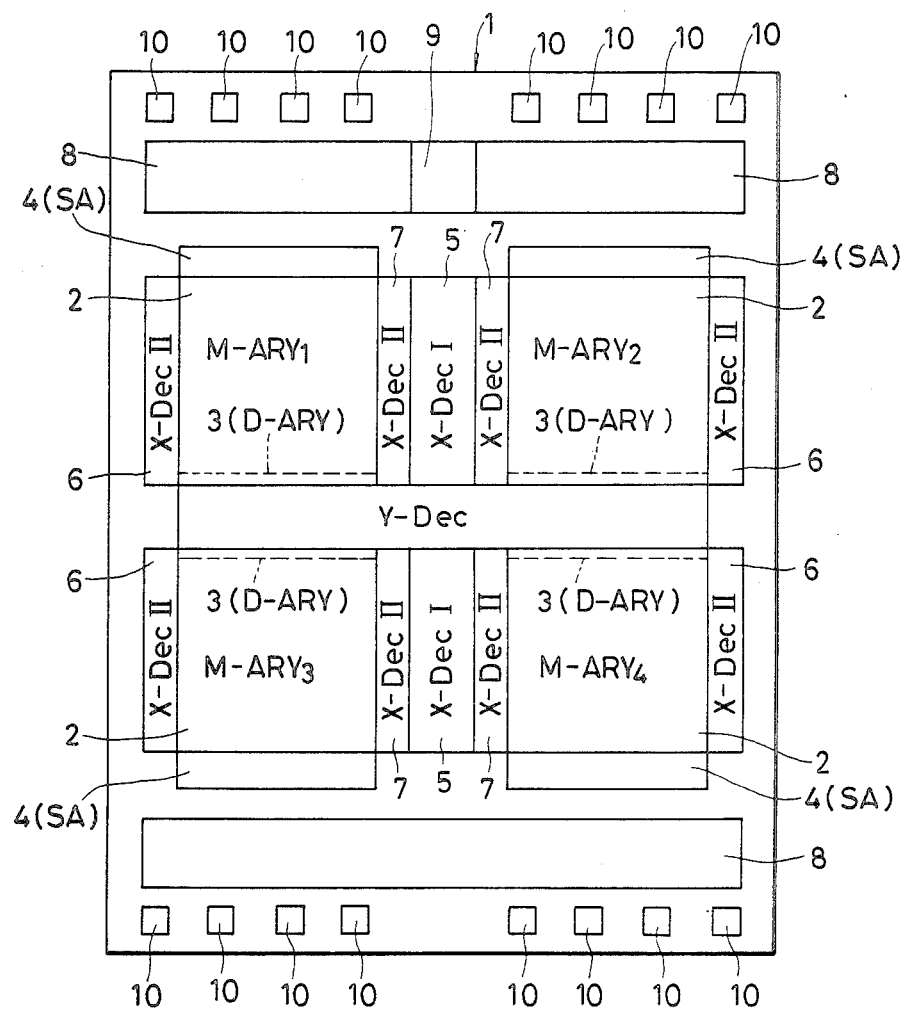
FIGS. 9 and 10 are schematic top plan views showing the DRAM for explaining the embodiment III of the present invention.
Figure 10:
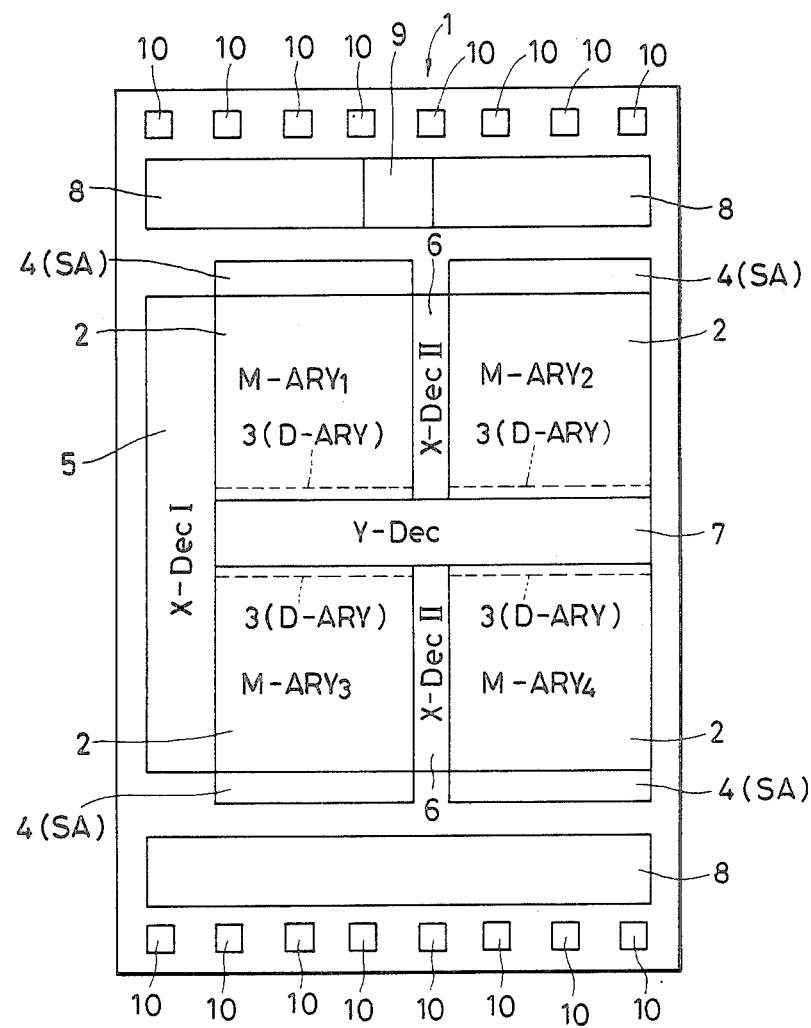

Embodiment III:

FIGS. 9 and 10 are schematic top plan views showing the layout patterns of the DRAMs adopting the folded bit line construction for explaining the embodiment III of the present invention. The present embodiment is directed to one semiconductor integrated circuit in which the so-called four-mat type DRAM having its memory cell array divided into four is used.

In FIG. 9, the X-decoders II are disposed at both the side portions of one memory cell array 2. As a result, the predetermined word line 18 can be selected from both side portions of the memory cell array 2 thereby to shorten the time period for the signal of the word line 18 to rise. As a result, the operating speed for writing and reading the data in and out of the DRAM can be improved.

In FIG. 10, the X-decoder I is arranged at one side of the plural memory cell arrays. In this case, the X-decoders II are interposed between the memory arrays M-ARY$_1$ and M-ARY$_2$ (and between the memory arrays M-ARY$_3$ and M-ARY$_4$). Moreover, the word lines are formed to extend from the X-decoders II to the memory arrays which are formed to interpose the former in between.

Incidentally, in the embodiments I, II and III, the X-decoder I is disposed in the direction to face the X-decoders II disposed in the predetermined positions of the memory cell array columns but may be disposed in the direction to intersect the X-decoders II.

Effects of the Invention:

The following effects can be attained in the semiconductor integrated circuit device adopting the double-layered aluminum wiring construction of the present invention.

(1) In the predetermined portions of the memory cell array columns in which the plural memory cell arrays are arranged in the column direction, there are disposed the X-decoders II which have their output portions connected electrically with the plural word lines of the memory cell arrays and their input portions connected electrically with the signal lines each for a predetermined number of word lines. The pitch between the adjoining signal lines can be made larger than that between the adjoining word lines. Also, the signal lines can be made of the second aluminum film. Therefore, working problems can be prevented by the action of loosening the design rule for making the signal line thereby to improve the reliability of the semiconductor integrated circuit device.

(2) The X-decoder for selecting the word lines is divided into the X-decoder I and the X-decoders II having a smaller area than the former and arranged in the predetermined portions of the memory cell array columns, and the signal lines for connecting electrically the X-decoder I and the X-decoders II are made common to eliminate the overlapped unnecessary X-decoder I so that the integration of the semiconductor integrated circuit device can be improved by the action capable of reducing the occupation area required for arranging the X-decoder I.

(3) By arranging the X-decoder I and the X-decoders II oppositely of each other, the delay time in the signal lines can be shortened by virtue of the resistance reduction of the signal lines for connecting electrically those decoders. This shortens the time period for timing the operations of the X-decoders II so that the operating speed of writing and reading the data in and out of the semiconductor integrated circuit device can be improved.

The following effect can also be attained in the DRAM adopting the double-layered aluminum wiring construction of the present invention.

(4) In the predetermined portions of the memory cell array columns in which the plural memory cell arrays are arranged in the column direction, there are disposed the X-decoders II which have their output portions connected electrically with the plural word lines of the memory cell arrays and their input portions connected electrically with the signal lines each for a predetermined number of word lines. The pitch between the adjoining signal lines can be made larger than that between the adjoining word lines by making the signal lines of the second aluminum film so that the working inferiorities can be prevented by the action of loosening the design rule for making the signal lines. This improves the reliability of the DRAM and shortens such a delay time of the word lines, thereby improving the operating speed of writing and reading the data in and out of the DRAM.

The invention conceived by the present inventor has been described specifically in connection with the preferred embodiments thereof. However, the present invention should not be limited to the above embodiments but can naturally be modified in various manners without departing from the gist thereof. In the foregoing embodiments, for example, one signal line is provided for two word lines so that either of the word lines is selected by the X-decoders. Despite this fact, one signal line may be provided for four or eight word lines, or any desired number, so that one of the word lines may be selected by the X-decoders II. Also, the foregoing description has been directed to the case in which the invention made by the inventor is applied to the DRAM or the field of application thereof. The present invention should not be limited thereto but may also be applied to semiconductor integrated circuit devices which are equipped with a static random access memory or a mask ROM (i.e., Read Only Memory) in order to shorten the delay time of the wires (i.e., the signal lines) formed by the predetermined conductive layer utilizing the teachings set forth in this disclosure.

I claim:

1. A semiconductor integrated circuit comprising:
   a memory cell array including a plurality of word lines extending in a column direction, a plurality of bit lines extending in a row direction and intersecting with said word lines, and a plurality of memory cells disposed in predetermined ones of said intersections between said word lines and said bit lines;
   a first decoder having an output portion connected electrically with said word lines; and
   a plurality of signal lines elongated on said memory array and connected electrically with an input portion of said decoder, wherein each of said signal lines is provided for a predetermined number of said word lines greater than or equal to two.

2. A semiconductor integrated circuit device as set forth in claim 1, wherein said signal lines are made of a conductive material having a lower sheet resistance than that of said word lines.

3. A semiconductor integrated circuit device as set forth in claim 1, wherein said signal lines are formed on an insulating film over said word lines and extend generally in said column direction.

4. A semiconductor integrated circuit device as set forth in claim 1, wherein said first decoder includes a plurality of switching circuits respectively coupled between each of said signal lines and said corresponding predetermined number of word lines, said switching circuits each being coupled to a selection line providing selection signals to said switching circuits to operate predetermined ones of said switching circuits to couple selected word lines to said signal lines.

5. A semiconductor integrated circuit device comprising:
   a memory cell array including a plurality of word lines extending in a column direction, a plurality of bit lines extending in a row direction and intersecting with said word lines, and a plurality of memory cells disposed in predetermined ones of said intersections between said word lines and said bit lines;
   a first decoder having an output portion connected electrically with said word lines; and
   a plurality of signal lines elongated on said memory array and connected electrically with an input portion of said decoder, wherein each of said signal lines is provided for a predetermined number of said word lines greater than or equal to two, wherein said first decoder includes a plurality of switching circuits respectively coupled between each of said signal lines and said corresponding predetermined number of word lines, said switching circuits each being coupled to a selection line providing selection signals to said switching circuits to operate predetermined ones of said switching circuits to couple selected word lines to said signal lines, wherein each of said switching circuits includes a switching IGFET and a cutting IGFET having a source and drain connected between a selection line and a gate of said switching IGFET, and wherein said cutting IGFET further includes a gate electrode connected to a reference potential line.

6. A semiconductor integrated circuit device comprising:

a memory cell array including a plurality of word lines extending in a column direction, a plurality of bit lines extending in a row direction and intersecting with said word lines, and a plurality of memory cells disposed in predetermined ones of said intersections between said word lines and said bit lines;

a first decoder having an output portion connected electrically with said word lines; and a plurality of signal lines elongated on said memory array and connected electrically with an input portion of said decoder, wherein each of said signal lines is provided for a predetermined number of said word lines greater than or equal to two, wherein each said memory cell comprises a storage capacitor and a selection IGFET having a source and drain connected between a bit line and said storage capacitor.

7. A semiconductor integrated circuit device as set forth in claim 1, wherein said word lines are comprises of polycrystalline silicon and said signal lines are comprised of aluminum.

8. A semiconductor integrated circuit device comprising:

a memory cell array including a plurality of word lines extending in a column direction, a plurality of bit lines extending in a row direction and intersecting with said word lines, and a plurality of memory cells disposed in predetermined ones of said intersections between said word lines and said bit lines;

a first decoder having an output portion connected electrically with said word lines; and a plurality of signal lines elongated on said memory array and connected electrically with an input portion of said decoder, wherein each of said signal lines is provided for a predetermined number of said word lines greater than or equal to two, further comprising a second decoder having an output portion coupled to said signal lines and an input portion coupled to receive selection signals for selecting a predetermined one of said signal lines.

9. A semiconductor integrated circuit device as set forth in claim 8, wherein said first and second decoders are located on opposite sides of said memory cell array with said signal lines extending from the output portion of said second decoder over said memory cell array to said input portion of said first decoder.

10. A semiconductor integrated circuit device as set forth in claim 8, wherein said integrated circuit device includes a plurality of said memory cell arrays arranged in said column direction, and wherein said first decoder is interposed between at least two of said memory cell arrays and wherein said second decoder is located at an end of said plurality of memory cell arrays so that at least one of said memory cell arrays is interposed between said first and second decoders with said signal lines extending over said memory cell array interposed between said first and second decoders.

11. A semiconductor integrated circuit device as set forth in claim 10, wherein said integrated circuit device comprises at least three memory cell arrays and wherein at least two of said first decoders are provided, each of said first decoders being located between a pair of said memory cell arrays and wherein said signal lines extend, in common, from said output portion of said second decoder over said memory cell array to input portions of each of said first decoders.

12. A semiconductor integrated circuit device as set forth in claim 8, wherein said integrated circuit device includes at least two memory cell arrays in said column direction, and wherein said second decoder is located between said two memory cell arrays and further wherein said integrated circuit device includes at least two first decoders located respectively on opposite sides of each of said memory cell arrays so that each memory cell array is interposed between said second decoder and one of said first decoders with said signal lines extending from the output portion of said second decoder over said memory cell arrays to said input portion of each of said first decoders.

13. A semiconductor integrated circuit device as set forth in claim 6, wherein each of said signal lines is comprised of a conductive material having a lower sheet resistance than that of each of said word lines.

14. A semiconductor integrated circuit device as set forth in claim 13, wherein said signal lines are formed on an insulating film over said word lines and extend generally in said column direction.

15. A semiconductor integrated circuit device as set forth in claim 14, wherein each of said word lines is comprised of polycrystalline silicon and each of said signal lines is comprised of aluminum.

16. A semiconductor integrated circuit device as set forth in claim 14, wherein said first decoder includes a plurality of switching circuits respectively coupled between each of said signal lines and said corresponding predetermined number of word lines, said switching circuits each being coupled to a selection line providing selection signals to said switching circuits to operate predetermined ones of said switching circuits to couple selected word lines to said signal lines.

17. A semiconductor integrated circuit device as set forth in claim 8, wherein each said memory cell comprises a storage capacitor and a selection IGFET having a source and drain connected between a bit line and said storage capacitor.

18. A semiconductor integrated circuit device as set forth in claim 17, wherein each of said signal lines is comprised of a conductive material having a lower sheet resistance than that of each of said word lines.

19. A semiconductor integrated circuit device as set forth in claim 18, wherein said signal lines are formed on an insulating film over said word lines and extend generally in said column direction.

20. A semiconductor integrated circuit device as set forth in claim 19, wherein each of said word lines is comprised of polycrystalline silicon and each of said signal lines is comprised of aluminum.

21. A semiconductor integrated circuit device as set forth in claim 19, wherein said first decoder includes a plurality of switching circuits respectively coupled between each of said signal lines and said corresponding predetermined number of word lines, said switching circuits each being coupled to a selection line providing selection signals to said switching circuits to operate predetermined ones of said switching circuits to couple selected word lines to said signal lines.

22. A semiconductor integrated circuit device as set forth in claim 9, wherein each said memory cell comprises a storage capacitor and a selection IGFET having a source and drain connected between a bit line and said storage capacitor.

23. A semiconductor integrated circuit device as set forth in claim 22, wherein each of said signal lines is comprised of a conductive material having a lower sheet resistance than that of each of said word lines.

24. A semiconductor integrated circuit device as set forth in claim 23, wherein said signal lines are formed on an insulating film over said word lines and extend generally in said column direction.

25. A semiconductor integrated circuit device as set forth in claim 24, wherein each of said word lines is comprised of polycrystalline silicon and each of said signal lines is comprised of aluminum.

26. A semiconductor integrated circuit device as set forth in claim 24, wherein said first decoder includes a plurality of switching circuits respectively coupled between each of said signal lines and said corresponding predetermined number of word lines, said switching circuits each being coupled to a selection line providing selection signals to said switching circuits to operate predetermined ones of said switching circuits to couple selected word lines to said signal lines.

* * * * *